US011197291B2

(12) United States Patent
Hui et al.

(10) Patent No.: US 11,197,291 B2
(45) Date of Patent: Dec. 7, 2021

(54) POLAR CODING FOR BEAM SWEEPING BROADCAST CHANNEL

(71) Applicant: Telefonaktiebolaget LM Ericsson (publ), Stockholm (SE)

(72) Inventors: Dennis Hui, Sunnyvale, CA (US); Yufei Blankenship, Kildeer, IL (US); Anders Wesslén, Staffanstorp (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 825 days.

(21) Appl. No.: 15/777,800

(22) PCT Filed: May 4, 2018

(86) PCT No.: PCT/EP2018/061508
§ 371 (c)(1),
(2) Date: May 21, 2018

(87) PCT Pub. No.: WO2018/202854
PCT Pub. Date: Nov. 8, 2018

(65) Prior Publication Data
US 2021/0176739 A1 Jun. 10, 2021

Related U.S. Application Data

(60) Provisional application No. 62/502,546, filed on May 5, 2017.

(51) Int. Cl.
*H04W 72/04* (2009.01)
*H04L 1/00* (2006.01)
(Continued)

(52) U.S. Cl.
CPC ......... *H04W 72/044* (2013.01); *H04L 1/0054* (2013.01); *H04L 1/0061* (2013.01);
(Continued)

(58) Field of Classification Search
CPC . H04W 72/044; H04W 72/005; H04W 48/10; H04L 1/0076; H04L 1/0054; H04L 1/0061
See application file for complete search history.

(56) References Cited

U.S. PATENT DOCUMENTS

2017/0331577 A1* 11/2017 Parkvall .................. H04W 8/18

FOREIGN PATENT DOCUMENTS

WO  2018 064407 A1  4/2018
WO  2018 106075 A   6/2018

OTHER PUBLICATIONS

Channel Polarization: A Method for Constructing Capacity-Achieving Codes for Symmetric Binary-Input Memoryless Channels by Erdal Arikan; IEEE Transactions on Information Theory, vol. 55, No. 7—Jul. 2009.

(Continued)

*Primary Examiner* — Jianye Wu
(74) *Attorney, Agent, or Firm* — Baker Botts, LLP

(57) ABSTRACT

According to some embodiments, a method in a wireless transmitter comprises: obtaining a first set of bits (comprising a non-time-varying component) for wireless transmission; concatenating a second set of bits (comprising a time-varying component (e.g., beam identifier)) to the first set of bits; encoding the concatenated first and second set of bits using a channel code; and transmitting the encoded bits to a wireless receiver. In some embodiments, transmitting the encoded bits to the wireless receiver comprises transmitting a first beam. The method may further comprise: concatenating a third set of bits (comprising a time-varying component (e.g., beam identifier)) to the first set of wireless bits; encoding the concatenated first and third set of bits using a channel code; and transmitting the encoded bits to a wireless receiver using a second beam.

12 Claims, 20 Drawing Sheets

(51) Int. Cl.
　　　H04W 48/10　　　(2009.01)
　　　H04W 72/00　　　(2009.01)
(52) U.S. Cl.
　　　CPC .......... H04L 1/0076 (2013.01); H04W 48/10 (2013.01); H04W 72/005 (2013.01)

(56) References Cited

OTHER PUBLICATIONS

List Decoding of Polar Codes by Ido Tal and Alexander Vardy; 2011 IEEE International Symposium on Information Theory Proceedings—2011.

A Semi-Parallel Successive-Cancellation Decoder for Polar Codes by Camile Leroux et al.; IEEE Transactions on Signal Processing, vol. 61, No. 2—Jan. 15, 2013.

3GPP TSG-RAN WG1 Meeting #88; Athens, Greece; Source: Ericsson; Title: NR-PBCH Design (R1-1702124)—Feb. 13-17, 2017.

3GPP TSG RAN WG1 meeting #88; Athens, Greece; Source: InterDigital Communications; Title: On Broadcast Channel Transmission (R1-1702318)—Feb. 13-17, 2017.

3GPP TSG RAN WG1 Meeting #88bis; Spokane USA; Source: Huawei, HiSilicon; Title: Channel Coding for PBCH (R1-1704249)—Apr. 3-7, 2017.

3GPP TSG-RAN WG1 #88bis; Spokane, USA; Source: Sequans Communications; Title: Discussion on SS time index indication (R1-1704599)—Apr. 3-7, 2017.

3GPP TSG RAN WG1 Meeting #88bis; Spokane, USA; Source: Huawei, HiSilicon; Title: Discussion on SS burst set composition and SS block time index indication (R1-1705052)—Apr. 3-7, 2017.

3GPP TSG-RAN WG4 Meeting #85; Reno, NV, USA; Source: Ericsson; Title: Simulation results for PBCH-DRMS sequence acquisition and PBCH demodulation (R4-1712785)—Nov. 27-Dec. 1, 2017.

PCT Notification of Transmittal of the International Search Report and the Written Opinion of the International Searching Authority, or the Declaration for International application No. PCT/EP2018/061508—Jul. 26, 2016.

* cited by examiner

PRIORITY

POLAR CODING FOR BEAM SWEEPING BROADCAST CHANNEL

PRIORITY

This nonprovisional application is a U.S. National Stage Filing under 35 U.S.C. § 371 of International Patent Application Serial No, PCT/EP2018/061508 filed May 4, 2018, and entitled "Polar Coding For. Beam Sweeping Broadcast Channel" which claims priority to U.S. Provisional Patent Application No. 62/502,546 filed May 5, 2017, both of which are hereby incorporated by reference in their entirety.

TECHNICAL FIELD

Particular embodiments are directed to wireless communications and, more particularly, to polar coding for beam sweeping broadcast channels.

INTRODUCTION

Polar codes, proposed by Arikan (E. Arikan, "Channel Polarization: A Method for Constructing Capacity-Achieving Codes for Symmetric Binary-Input Memoryless Channels," IEEE Transactions on Information Theory, vol. 55, pp. 3051-3073, July 2009), are the first class of constructive coding schemes that are provable to achieve the symmetric capacity of the binary-input discrete memoryless channels under a low-complexity successive cancellation (SC) decoder. The finite-length performance of polar codes under SC, however, is not competitive compared to other modern channel coding schemes, such as low-density parity-check (LDPC) codes and Turbo codes. A SC list (SCL) decoder proposed in I. Tal and A. Vardy, "List Decoding of polar codes," in Proceedings of IEEE Symp. Inf. Theory, pp. 1-5, 2011 can approach the performance of optimal maximum-likelihood (ML) decoder. By concatenating a simple cyclic redundancy check (CRC) coding, the performance of concatenated polar codes is competitive with that of well-optimized LDPC and Turbo codes. As a result, polar codes may be used for 5G wireless communication systems.

Polar coding transforms a pair of identical binary-input channels into two distinct channels of different qualities, one better and one worse than the original binary-input channel. Repeating such a pair-wise polarizing operation on a set of $2^M$ independent uses of a binary-input channel results in a set of $2^M$ bit-channels of varying qualities. Some of the bit channels are nearly perfect (i.e., error free), while the rest are nearly useless (i.e., totally noisy). Polar coding uses the nearly perfect channel to transmit data to the receiver while setting the input to the useless channels to have fixed or frozen values (e.g., 0) known to the receiver. The input bits to the nearly useless and the nearly perfect channel are commonly referred to as frozen bits and non-frozen (or information) bits, respectively.

Only the non-frozen bits are used to carry data in a polar code. Loading the data into the proper information bit locations has a direct impact on the performance of a polar code. An illustration of the structure of a length-8 polar code is illustrated in FIG. 1.

FIG. 2 illustrates the labeling of the intermediate info bits $s_{l,i}$, where $l \in \{0,1,\ldots,n\}$ and $i \in \{0,1,\ldots,N-1\}$ during polar encoding with N=8. The intermediate info bits are related by the following equation: $s_{l+1,i} = s_{l,i} \oplus s_{l,i+2^l}$, for $l \in \{0,1,\ldots,n-1\}$ and $i \in \{0,1,\ldots,N-1\}$, with $s_{0,i} = u_i$ being the info bits, and $s_{n,i} = x_i$ being the code bits, for $i \in \{0,1,\ldots,N-1\}$.

Some transmitters may include beam sweeping. Fifth generation (5G) New Radio (NR) communication systems can operate with carrier frequencies ranging from hundreds of MHz to hundreds of GHz. When operating in very high frequency band, such as the millimeter-wave (mmW) bands (~30-300 GHz), radio signals attenuate much more quickly with distance than those in lower frequency band (e.g. 1-3 GHz). Thus, to broadcast system information to user equipment (UE) over the same intended coverage area, beamforming is typically used to achieve power gain to compensate the path loss in high frequencies.

Because the signal coverage of each beam can be quite narrow when many antennas are used to form the beam, the system information is broadcast or transmitted at a different beam direction one at a time. The process of transmitting signals carrying the same information using beams with different (azimuth and/or elevation) directions one at a time is commonly referred to as beam sweeping.

Because typically only one of the many beams carrying the same system information can reach a particular receiver with good signal strength, the receiver does not know the location of the received beam in the overall radio frame structure. To enable the receiver to determine the start and the end of a periodic radio frame, a time index is often included when broadcasting the system information through beam sweeping.

For example, FIG. 3 shows an example of how system information can be broadcast together with reference synchronization signal (SS) through beam sweeping. In the illustrated example, the system information is carried by a NR physical broadcast channel (NR-PBCH) transmitted in multiple synchronization blocks (SSB), each beamformed in a different direction. The SSBs are repeated within a certain NR-PBCH transmission time period (TTI, 80 ms in the illustrated example). Within a NR-PBCH TTI, the system information carried by the NR-PBCH master information block (MIB) in each SSB is the same. Each NR-PBCH also carries a time index for the receiver to determine the radio frame boundaries. NR-PBCH may be encoded using polar codes.

A particular problem is that because a receiver is often not located exactly at the peak of the main lobe of any beam, to improve signal reception, it would be beneficial if the receiver could combine signals from adjacent blocks of transmitted signals because more than one beam can yield similar signal strengths. Because of the block-dependent time index, however, the contents transmitted in adjacent beams are slightly different (i.e., everything is the same except for the time index). As a result, the receiver cannot directly add the received log-likelihood ratios (LLRs) of the channel code bits from adjacent blocks. Proper design of the transmitted signal is needed to ensure the receiver can combine signals from signal blocks that are adjacent in time.

SUMMARY

The embodiments described herein encode the time index separately using a second channel code of the same block length as the polar code used for encoding the system information. The codeword is superposed or added (i.e., exclusive-OR (XOR) operation) to the polar codeword used to represent the system information to generate a final codeword. The two codes essentially are combined into a superposition code. At the receiver, to combine the received log-likelihood ratios (LLRs) from adjacent signal blocks (or beams), the receiver computes the codeword of the second channel code that corresponds to the hypothesized difference in time index in adjacent signal blocks and uses the codeword to flip the signs in the LLR values from adjacent blocks before adding them together into a combined LLR, which may be used to decode both the time index and the system information.

In a particular embodiment, the second channel code is also a polar code of the same block length. In this case, because a polar code is a linear code, the encoding process may be simplified by first adding (i.e., XOR-ing) the cyclic redundancy check (CRC) bits to the time index before encoding the combined CRC-time-index using a polar encoder. An advantage of using a polar code as the second channel code for the time index is that after combining LLRs with adjacent blocks, the data bits and the combined CRC-time-index can be decoded directly by a successive cancellation (list) decoder without further hypothesizing the value of the time index and performing decoding for each hypothesized time index. This can significantly improve the latency of the decoding.

According to some embodiments, a method in a wireless transmitter (e.g., network node) comprises obtaining a first set of bits for wireless transmission. The first set of bits comprise a non-time-varying component (e.g., system information such as a MIB). The method further comprises concatenating a second set of bits to the first set of bits. The second set of bits comprise a time-varying component (e.g., time index, such as a synchronization signal block (SSB) index). The method further comprises encoding (e.g., polar encoding) the concatenated first and second set of bits using a channel code and transmitting (e.g., via NR-PBCH) the encoded bits to a wireless receiver (e.g., wireless device). The time varying-component of the second set of bits may be associated with a transmit beam.

In particular embodiments, the method further comprises determining CRC bits for the concatenated first and second set of bits and concatenating the determined CRC bits to the concatenated first and second set of bits. In some embodiments, concatenating the second set of bits to the first set of bits comprises determining CRC bits for the second set of bits and concatenating the determined CRC bits to the second set of bits.

In particular embodiments, transmitting the encoded bits to the wireless receiver comprises transmitting a first beam, and the method further comprises concatenating a third set of bits to the first set of wireless bits. The third set of bits comprise a time-varying component (e.g., time index, such as a synchronization signal block (SSB) index) different from the second set of bits. The method may further comprise encoding the concatenated first and third set of bits using a channel code (e.g., polar coding) and transmitting the encoded bits to a wireless receiver (e.g., wireless device) using a second beam. The time-varying component of the third set of bits may be associated with the second beam.

In particular embodiments, the first beam is transmitted in a first direction and the second beam is transmitted in a second direction different than the first direction. The first beam may be adjacent the second beam. In some embodiments, the first beam is transmitted in a first transmission time interval (TTI) and the second beam is transmitted in a second TTI different than the first TTI.

According to some embodiments, a wireless transmitter (e.g., network node) comprises processing circuitry operable to obtain a first set of bits for wireless transmission. The first set of bits comprising a non-time-varying component (e.g., system information such as a MIB). The processing circuitry is further operable to concatenate a second set of bits to the first set of bits. The second set of bits comprising a time-varying component (e.g., time index, such as a SSB index). The processing circuitry is further operable to encode (e.g., polar encode) the concatenated first and second set of bits using a channel code and transmit (e.g., via NR-PBCH) the encoded bits to a wireless receiver (e.g., wireless device). The time varying-component of the second set of bits may be associated with a transmit beam.

In particular embodiments, the processing circuitry further operable to determine CRC bits for the concatenated first and second set of bits and concatenate the determined CRC bits to the concatenated first and second set of bits. In some embodiments, the processing operable to concatenate the second set of bits to the first set of bits is operable to determine CRC bits for the second set of bits and concatenate the determined CRC bits to the second set of bits.

In particular embodiments, the processing circuitry is operable to transmit the encoded bits to the wireless receiver by transmitting a first beam. The processing circuitry may be further operable to concatenate a third set of bits to the first set of wireless bits. The third set of bits comprises a time-varying component (e.g., time index, such as a SSB index) different from the second set of bits. The processing circuitry may be further operable to encode the concatenated first and third set of bits using a channel code and transmit the encoded bits to a wireless receiver using a second beam. The time-varying component of the third set of bits may be associated with the second beam.

In particular embodiments, the processing circuitry is operable to transmit the first beam in a first direction and transmit the second beam in a second direction different than the first direction. The first beam may be adjacent the second beam. In some embodiments, the processing circuitry is operable to transmit the first beam in a first TTI and transmit the second beam in a second TTI different than the first TTI.

According to some embodiments, a method in a wireless receiver comprises receiving (e.g., via NR-PBCH) a first signal block on a first beam. The first signal block comprises a first set of bits encoded with a channel code and representing a non-time-varying component (e.g., system information such as a MIB) and a second set of bits encoded with the channel code representing a first time-varying component (e.g., time index, such as a SSB index). The method further comprises decoding (e.g., polar decoding) the first set of coded bits by decoding the first signal block.

In particular embodiments, the method further comprises receiving a second signal block on a second beam. The second signal block comprises the first set of bits encoded with the channel code and representing the non-time-varying component and a third set of bits encoded with the channel code representing a second time-varying component (e.g., time index, such as a SSB index) different than the first time-varying component. The method further comprises: removing the first time-varying component from the first signal block; removing the second time-varying component from the second signal block; combining the first signal block and the second signal block; and decoding (e.g., polar decoding) the first set of coded bits by decoding the combined first and second signal blocks. The time varying-component of the second set of bits may be associated with the first beam and the time varying-component of the third set of bits may be associated with the second beam.

In particular embodiments, removing the first and second time-varying component comprises hypothesis testing. Removing the first and second time-varying component may comprise applying an orthogonal cover code.

In particular embodiments, the first beam is received from a first direction and the second beam is received from a second direction different than the first direction. The first beam may be adjacent the second beam. In some embodiments, the first beam is received in a first TTI and the second beam is received in a second TTI different than the first TTI.

According to some embodiments, a wireless receiver (e.g., wireless device) comprises processing circuitry operable to receive (e.g., via NR-PBCH) a first signal block on a first beam. The first signal block comprises a first set of bits encoded with a channel code and representing a non-time-varying component (e.g., system information such as a MIB) and a second set of bits encoded with the channel code representing a first time-varying component (e.g., time index, such as a SSB index). The processing circuitry is operable to decode (e.g., polar decode) the first set of coded bits by decoding the first signal block.

In particular embodiments, the processing circuitry is further operable to receive a second signal block on a second beam. The second signal block comprises the first set of bits encoded with the channel code and representing the non-time-varying component and a third set of bits encoded with the channel code representing a second time-varying component (e.g., time index, such as a SSB index) different than the first time-varying component. The processing circuitry is further operable to remove the first time-varying component from the first signal block; remove the second time-varying component from the second signal block; combine the first signal block and the second signal block; and decode (e.g., polar decode) the first set of coded bits by decoding the combined first and second signal blocks. The time varying-component of the second set of bits may be associated with the first beam and the time varying-component of the third set of bits may be associated with the second beam.

In particular embodiments, the processing circuitry is operable to remove the first and second time-varying component using hypothesis testing. The processing circuitry may be operable to remove the first and second time-varying component by applying an orthogonal cover code.

In particular embodiments, the processing circuitry is operable to receive the first beam from a first direction and receive the second beam from a second direction different than the first direction. The first beam may be adjacent the second beam. In some embodiments, the first beam is received in a first TTI and the second beam is received in a second TTI different than the first TTI.

According to some embodiments, a wireless transmitter comprises a transmitting module and an encoding module. The encoding module is operable to obtain a first set of bits for wireless transmission. The first set of bits comprises a non-time-varying component. The encoding module is further operable to concatenate a second set of bits to the first set of bits. The second set of bits comprises a time-varying component. The encoding module is further operable to encode the concatenated first and second set of bits using a channel code. The transmitting module is operable to transmit the encoded bits to a wireless receiver.

According to some embodiments, a wireless receiver comprises a receiving module and a decoding module. The receiving module operable to receive a first signal block on a first beam. The first signal block comprises a first set of bits encoded with a channel code and representing a non-time-varying component and a second set of bits encoded with the channel code representing a first time-varying component. The receiving module is further operable to receive a second signal block on a second beam. The second signal block comprises the first set of bits encoded with the channel code and representing the non-time-varying component and a third set of bits encoded with the channel code representing a second time-varying component different than the first time-varying component. The decoding module is operable to remove the first time-varying component from the first signal block; remove the second time-varying component from the second signal block; combine the first signal block and the second signal block; and decode the first set of coded bits by decoding the combined first and second signal blocks.

Also disclosed is a computer program product. The computer program product comprises instructions stored on non-transient computer-readable media which, when executed by a processor, perform the step of obtaining a first set of bits for wireless transmission. The first set of bits comprise a non-time-varying component. The instructions further perform the step of concatenating a second set of bits to the first set of bits. The second set of bits comprise a time-varying component. The instructions further perform the steps of encoding the concatenated first and second set of bits using a channel code and transmitting the encoded bits to a wireless receiver.

Another computer program product comprises instructions stored on non-transient computer-readable media which, when executed by a processor, perform the step of receiving a first signal block on a first beam. The first signal block comprises a first set of bits encoded with a channel code and representing a non-time-varying component and a second set of bits encoded with the channel code representing a first time-varying component. The instructions further perform the step of receiving a second signal block on a second beam. The second signal block comprises the first set of bits encoded with the channel code and representing the non-time-varying component and a third set of bits encoded with the channel code representing a second time-varying component different than the first time-varying component. The instructions further perform the steps of: removing the first time-varying component from the first signal block; removing the second time-varying component from the second signal block; combining the first signal block and the second signal block; and decoding the first set of coded bits by decoding the combined first and second signal blocks.

Particular embodiments may exhibit some of the following technical advantages. For example, a particular advantage of the proposed superposition code structure is that the code used to encode the time index, which is time-varying (i.e., changing from one transmission block to another) may be separate from the code used to encode data (or system information), which is not time-varying. As a result, particular embodiments may use a code for the time index that has a good distance property and enables easy combining of the LLRs from adjacent blocks without affecting the channel code used for the system information.

According to some embodiments, an advantage of using a polar code as the second channel code for the time index is that after combining LLRs with adjacent blocks, the data bits and the combined CRC-time-index can be decoded directly by a successive cancellation (list) decoder without further hypothesizing the value of the time index and performing decoding for each hypothesized time index. This can significantly improve the latency of the decoding. Other technical advantages will be readily apparent to one skilled in the art from the following figures, description and example embodiments.

BRIEF DESCRIPTION OF THE DRAWINGS

For a more complete understanding of the embodiments and their features and advantages, reference is now made to the following description, taken in conjunction with the accompanying drawings, in which.

DETAILED DESCRIPTION

Figure 1:
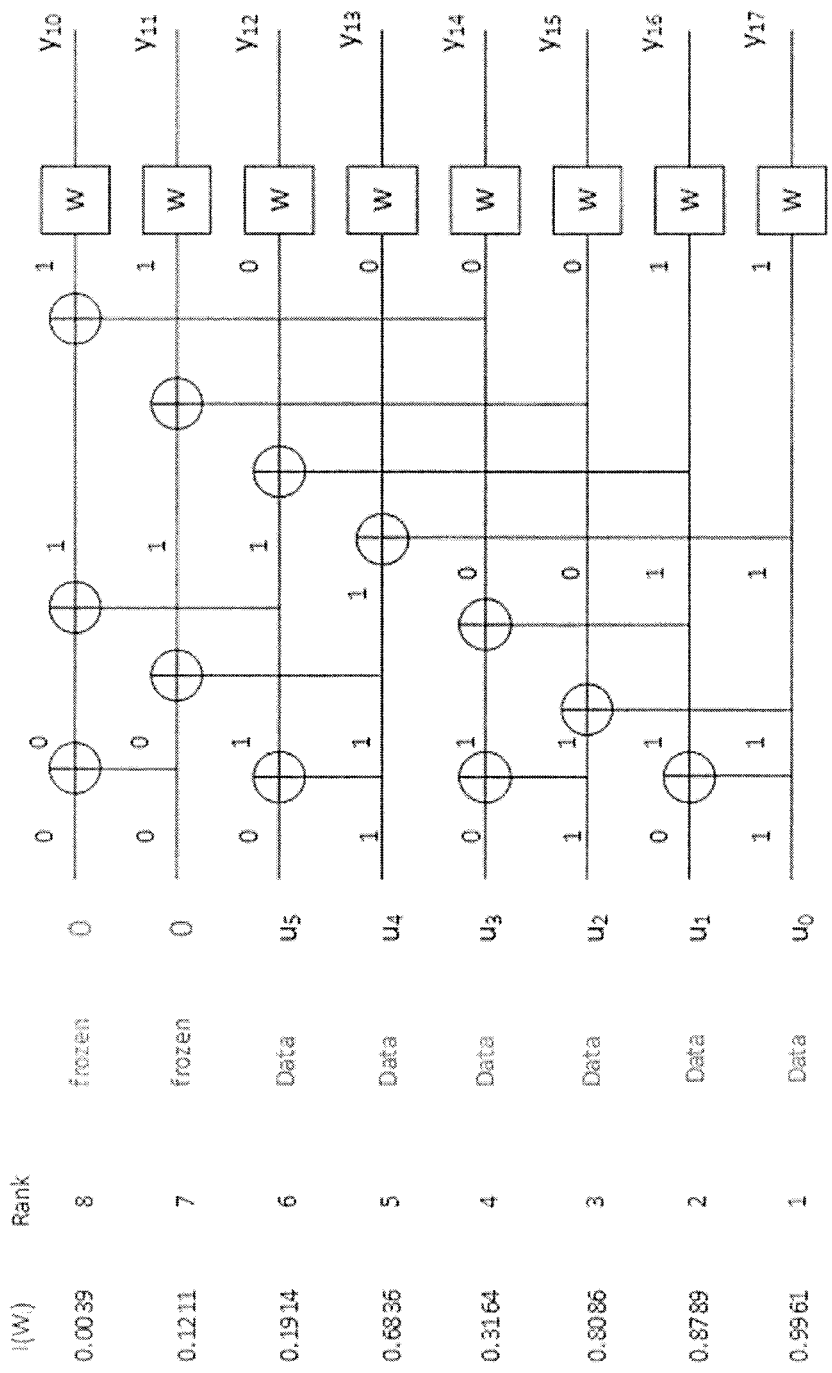
FIG. 1 illustrates an example of a polar code structure with N=8.
Figure 2:
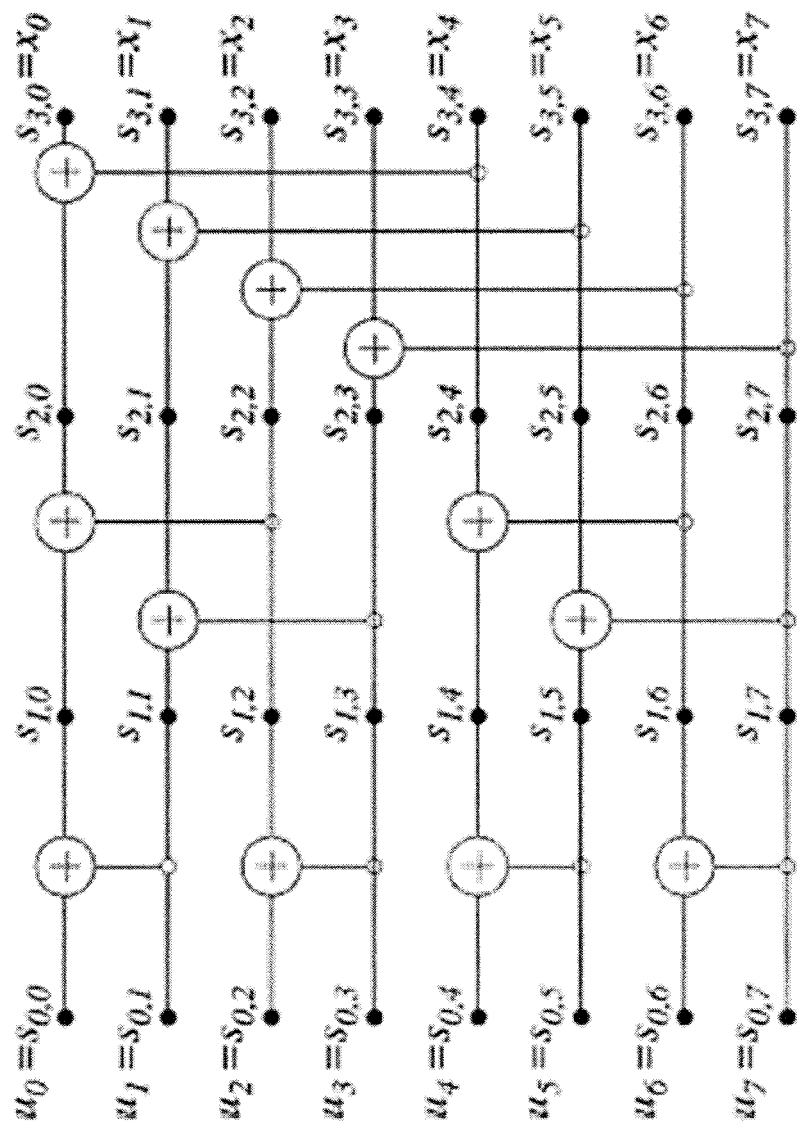
FIG. 2 illustrates an example polar code encoder with N=8.
Figure 3:
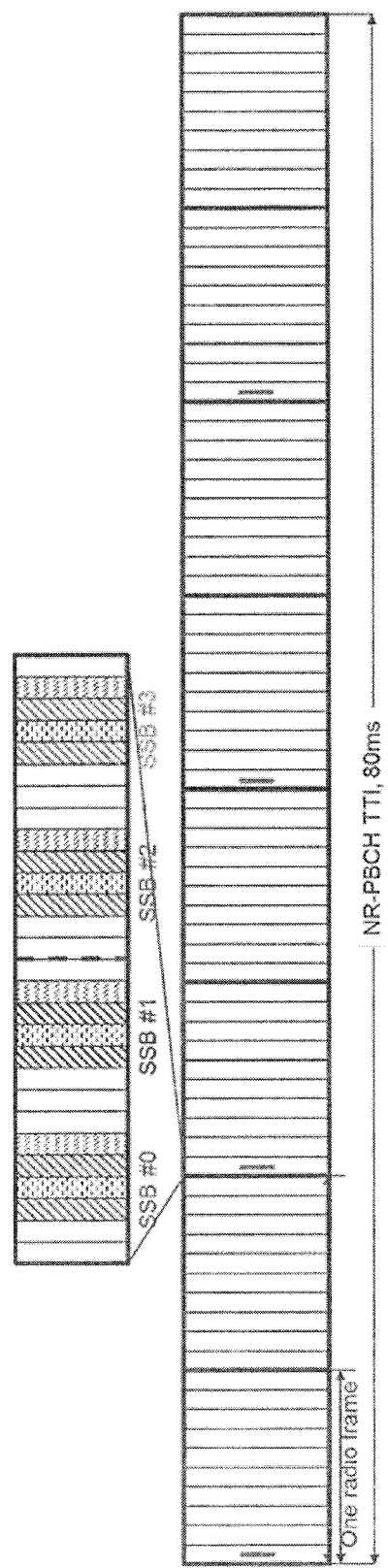
FIG. 3 illustrates an example of a synchronization signal structure with system information broadcasted with beam sweeping.

Polar codes may be used for fifth generation (5G) wireless communication systems. Polar coding transforms a pair of identical binary-input channels into two distinct channels of different qualities, one better and one worse than the original binary-input channel. Repeating such a pair-wise polarizing operation on a set of $2^M$ independent uses of a binary-input channel results in a set of $2^M$ bit-channels of varying qualities. Some of the bit channels are nearly perfect (i.e., error free), while the rest of them are nearly useless (i.e., totally noisy). Polar coding uses the nearly perfect channel to transmit data to the receiver while setting the input to the useless channels to have fixed or frozen values (e.g., 0) known to the receiver.

Some transmitters may include beam sweeping. To broadcast system information to user equipment (UE) over the same intended coverage area, beamforming is typically used to achieve power gain to compensate the path loss in high frequencies. Because the signal coverage of each beam can be quite narrow when many antennas are used to form the beam, the system information is broadcast or transmitted at a different beam direction one at a time. The process of transmitting signals carrying the same information using beams with different (azimuth and/or elevation) directions one at a time is commonly referred to as beam sweeping.

A particular problem is that because a receiver is often not located exactly at the peak of the main lobe of any beam, to improve signal reception, it would be beneficial if the receiver could combine signals from adjacent blocks of transmitted signals because more than one beam can yield similar signal strengths. Because of the block-dependent time index, however, the contents transmitted in adjacent beams are slightly different (i.e., everything is the same except for the time index). As a result, the receiver cannot directly add the received log-likelihood ratios (LLRs) of the channel code bits from adjacent blocks.

Particular embodiments obviate the problems described above and apply superposition coding based on polar codes, where a time-varying component (time index) is encoded and super-imposed on the non-time-varying component (system information, e.g., master information block (MIB) content in new radio (NR)). At the receiver side, the time-varying component can be removed, leaving the non-time-varying component only, so that multiple copies of the non-time-varying components can be accumulated and decoded.

The embodiments described herein encode the time index separately using a second channel code of the same block length as the polar code used for encoding the system information. The codeword is superposed or added (i.e., exclusive-OR (XOR) operation) to the polar codeword used to represent the system information to generate a final codeword. The two codes essentially are combined into a superposition code. At the receiver, to combine the received LLRs from adjacent signal blocks (or beams), the receiver computes the codeword of the second channel code that corresponds to the hypothesized difference in time index in adjacent signal blocks and uses this codeword to flip the signs in the LLR values from adjacent blocks before adding them together into a combined LLRs, which may then be used to decode both the time index and the system information.

In some embodiments, the second channel code is also a polar code of the same block length. In this case, because a polar code is a linear code, the encoding process may be simplified by first adding (i.e., XOR-ing) the cyclic redundancy check (CRC) bits to the time index before encoding the combined CRC-time-index using a polar encoder. An advantage of using a polar code as the second channel code for the time index is that after combining LLRs with adjacent blocks, the data bits and the combined CRC-time-index can be decoded directly by a successive cancellation (list) decoder without further hypothesizing the value of the time index and performing decoding for each hypothesized time index. This can significantly improve the latency of the decoding.

A particular advantage of the proposed superposition code structure is that the code used to encode the time index, which is time-varying (i.e., changing from one transmission block to another) may be separate from the code used to encode data (or system information), which is not time-varying. As a result, particular embodiments may use a code for the time index that has a good distance property and enables easy combining of the LLRs from adjacent blocks without affecting the channel code used for the system information.

According to some embodiments, an advantage of using a polar code as the second channel code for the time index is that after combining LLRs with adjacent blocks, the data bits and the combined CRC-time-index can be decoded directly by a successive cancellation (list) decoder without further hypothesizing the value of the time index and performing decoding for each hypothesized time index. This can significantly improve the latency of the decoding.

The following description sets forth numerous specific details. It is understood, however, that embodiments may be practiced without these specific details. In other instances, well-known circuits, structures and techniques have not been shown in detail in order not to obscure the understanding of this description. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to implement such feature, structure, or characteristic in connection with other embodiments, whether or not explicitly described.

Particular embodiments are described with reference to FIGS. 4-18B of the drawings, like numerals being used for like and corresponding parts of the various drawings. Long term evolution (LTE) and NR are used throughout this disclosure as an example cellular system, but the ideas presented herein may apply to other wireless communication systems as well.

Figure 4:
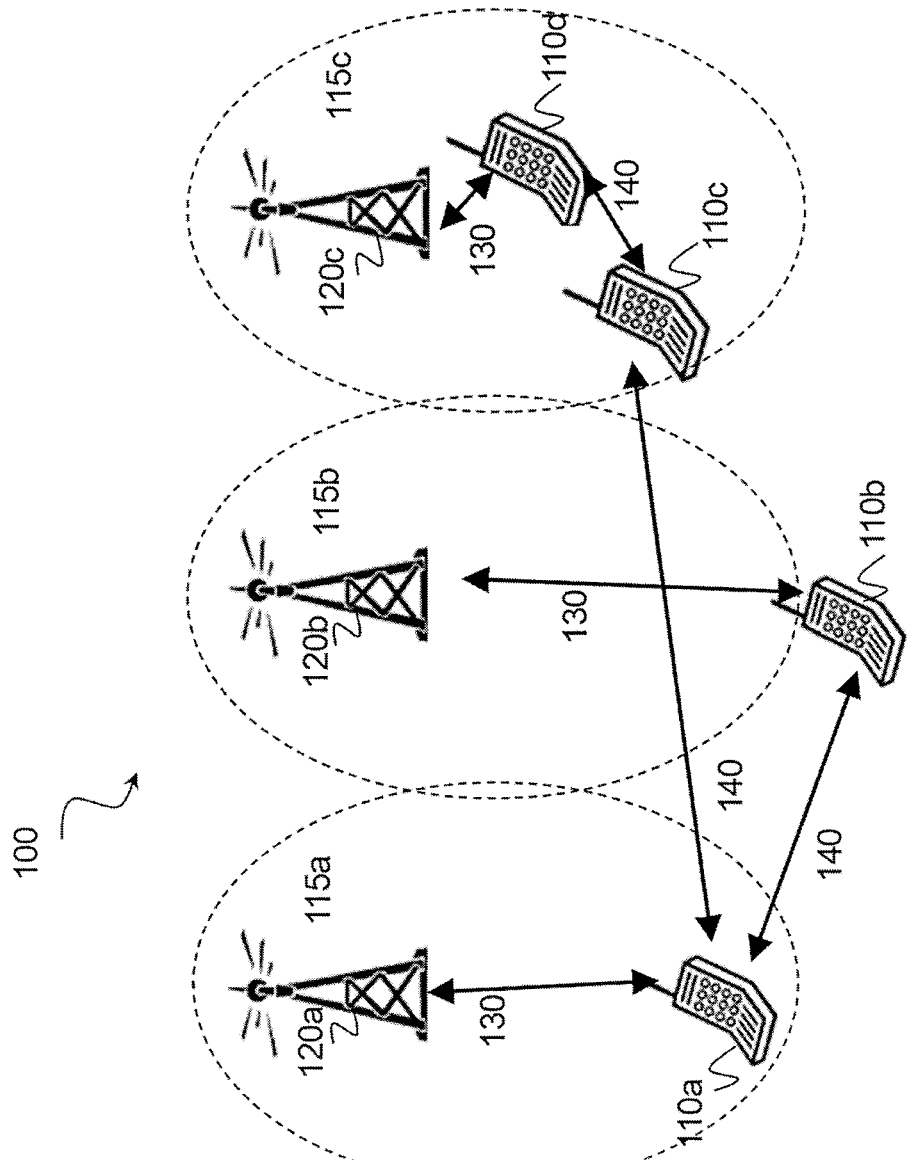
FIG. 4 is a block diagram illustrating an example wireless network, according to some embodiments.

FIG. 4 is a block diagram illustrating an example wireless network, according to a particular embodiment. Wireless network 100 includes one or more wireless devices 110 (such as mobile phones, smart phones, laptop computers, tablet computers, MTC devices, V2X devices, or any other devices that can provide wireless communication) and a plurality of network nodes 120 (such as base stations or eNodeBs). Wireless device 110 may also be referred to as a UE. Network node 120 serves coverage area 115 (also referred to as cell 115).

In general, wireless devices 110 that are within coverage of network node 120 (e.g., within cell 115 served by network node 120) communicate with network node 120 by transmitting and receiving wireless signals 130. For example, wireless devices 110 and network node 120 may communicate wireless signals 130 containing voice traffic, data traffic, and/or control signals.

A network node 120 communicating voice traffic, data traffic, and/or control signals to wireless device 110 may be referred to as a serving network node 120 for the wireless device 110. Communication between wireless device 110 and network node 120 may be referred to as cellular communication. Wireless signals 130 may include both downlink transmissions (from network node 120 to wireless devices 110) and uplink transmissions (from wireless devices 110 to network node 120). In LTE, the interface for communicating wireless signals between network node 120 and wireless device 110 may be referred to as a Uu interface.

Each network node 120 may have a single transmitter or multiple transmitters for transmitting signals 130 to wireless devices 110. In some embodiments, network node 120 may comprise a multi-input multi-output (MIMO) system. Similarly, each wireless device 110 may have a single receiver or multiple receivers for receiving signals 130 from network nodes 120 or other wireless devices 110.

Wireless devices 110 may communicate with each other (i.e., D2D operation) by transmitting and receiving wireless signals 140. For example, wireless device 110a may communicate with wireless device 110b using wireless signal 140. Wireless signal 140 may also be referred to as sidelink 140. Communication between two wireless devices 110 may be referred to as D2D communication or sidelink communication. In LTE, the interface for communicating wireless signal 140 between wireless device 110 may be referred to as a PC5 interface.

Wireless device 110, network node 120, or any other component of network 100 that transmits wireless signals may be referred to as a wireless transmitter. Wireless device 110, network node 120, or any other component of network 100 that receives wireless signals may be referred to as a wireless receiver.

In particular embodiments, wireless device 110 and network node 120 may encode and decode wireless signals 130 using polar coding. Network node 120 may transmit wireless signals 130 using beam sweeping.

For example, network node 120 may obtain (e.g., receive from higher layer) a first set of bits for wireless transmission. The first set of bits may comprise a non-time-varying component (e.g., system information such as a MIB). Network node 120 may concatenate a second set of bits to the first set of bits. The second set of bits comprise a time-varying component (e.g., time index, such as a synchronization signal block (SSB) index). Network node 120 may encode (e.g., polar encoding) the concatenated first and second set of bits using a channel code and transmit (e.g., via NR-PBCH) the encoded bits to wireless device 110. The time varying-component of the second set of bits may be associated with a transmit beam.

In particular embodiments, network node 120 may determine CRC bits for the concatenated first and second set of bits and concatenate the determined CRC bits to the concatenated first and second set of bits. In some embodiments, network node 120 concatenates the second set of bits to the first set of bits by determining CRC bits for the second set of bits and concatenating the determined CRC bits to the second set of bits.

In particular embodiments, network node 120 transmits the encoded bits to wireless device 110 over a first beam. Network node 120 may concatenate a third set of bits to the first set of wireless bits. The third set of bits comprise a time-varying component (e.g., time index, such as a SSB index) different from the second set of bits. Network node 120 may encode the concatenated first and third set of bits using a channel code (e.g., polar coding) and transmit the encoded bits to wireless device 110 using a second beam.

The time-varying component of the third set of bits may be associated with the second beam.

In particular embodiments, network node 120 transmits the first beam in a first direction and the second beam in a second direction different than the first direction. The first beam may be adjacent the second beam. In some embodiments, network node 120 transmits the first beam in a first transmission time interval (TTI) and the second beam in a second TTI different than the first TTI.

In some embodiments, wireless device 110 may receive (e.g., via NR-PBCH) a first signal block on a first beam. The first signal block comprises a first set of bits encoded with a channel code and representing a non-time-varying component (e.g., system information such as a MIB) and a second set of bits encoded with the channel code representing a first time-varying component (e.g., time index, such as a SSB index).

In some embodiments, wireless device 110 may decode the first signal block using, for example, polar decoding. In some embodiments, wireless device 110 may soft combine multiple signal blocks.

For example, in some embodiments, wireless device 110 may receive a second signal block on a second beam. The second signal block comprises the first set of bits encoded with the channel code and representing the non-time-varying component and a third set of bits encoded with the channel code representing a second time-varying component (e.g., time index, such as a SSB index) different than the first time-varying component.

Wireless device 110 may remove the first time-varying component from the first signal block and remove the second time-varying component from the second signal block. Wireless device 110 may combine the first signal block and the second signal block and decode (e.g., polar decoding) the first set of coded bits by decoding the combined first and second signal blocks. The time varying-component of the second set of bits may be associated with the first beam and the time varying-component of the third set of bits may be associated with the second beam.

In particular embodiments, wireless device 110 removes the first and second time-varying component using hypothesis testing. Removing the first and second time-varying component may comprise applying an orthogonal cover code.

In particular embodiments, wireless device 110 may receive the first beam from a first direction and the second beam from a second direction different than the first direction. The first beam may be adjacent the second beam. In some embodiments, wireless device 110 receives the first beam in a first TTI and the second beam in a second TTI different than the first TTI.

Particular examples are described in which a network node is the wireless transmitter and a wireless device is the wireless receiver. In other embodiments, the wireless device may be the wireless transmitter, and a network node or another wireless device may be the wireless receiver.

In particular embodiments, wireless device 110 and network node 120 may encode and decode wireless signals 130 according to any of the examples and embodiments described herein, such as with respect to FIGS. 5-14.

In wireless network 100, each network node 120 may use any suitable radio access technology, such as long term evolution (LTE), 5G NR, LTE-Advanced, UMTS, HSPA, GSM, cdma2000, NR, WiMax, WiFi, and/or other suitable radio access technology. Wireless network 100 may include any suitable combination of one or more radio access technologies. For purposes of example, various embodiments may be described within the context of certain radio access technologies. However, the scope of the disclosure is not limited to the examples and other embodiments could use different radio access technologies.

As described above, embodiments of a wireless network may include one or more wireless devices and one or more different types of radio network nodes capable of communicating with the wireless devices. The network may also include any additional elements suitable to support communication between wireless devices or between a wireless device and another communication device (such as a landline telephone). A wireless device may include any suitable combination of hardware and/or software. For example, in particular embodiments, a wireless device, such as wireless device 110, may include the components described with respect to FIG. 17A below. Similarly, a network node may include any suitable combination of hardware and/or software. For example, in particular embodiments, a network node, such as network node 120, may include the components described with respect to FIG. 18A below.

As an overview of transmitter and receiver processing, the basic idea is that superposition coding can be applied, where a time-varying component is encoded and super-imposed on the non-time-varying component. At the receiver side, the time-varying component can be removed, leaving the non-time-varying component only, so that multiple copies of the non-time-varying components can be accumulated and decoded.

The following is an overview on the general structure of transmitter and receiver processing when a polar code is used to transmit the non-time varying (e.g., system information or MIB content in NR) component of information, while another channel code, possibly a polar code as well, is used to transmit the time-varying component (e.g., Time Index).

Figure 5:
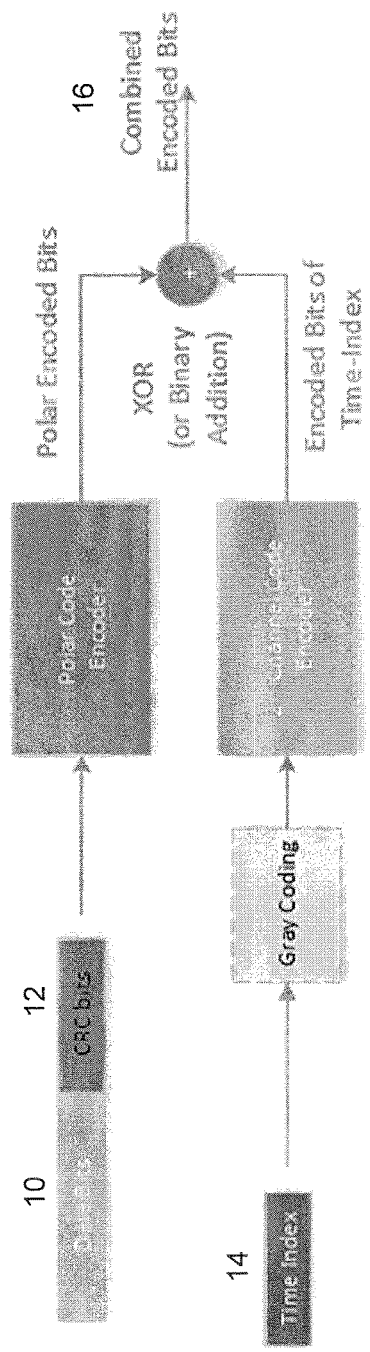
FIG. 5 is a block diagram of an encoding mechanism with superposition coding, according to some embodiments.

On the transmitter side, FIG. 5 is a block diagram illustrating an encoder of particular embodiments for superposition coding of data (e.g., system information) and time index. As illustrated, time index 14 is first encoded by an optional Gray code before encoding with a second channel code. The codeword generated by the encoder of the second channel code is then added or XOR-ed with the polar coded bits generated from data bits 10 and CRC bits 12 to form a combined or superposition codeword 16.

A reason for the optional Gray coding is that the Gray codewords for adjacent time index only differ in one bit, which directly translate into a codeword in the generating matrix of the second channel code. As illustrated later, no effort is needed to find the corresponding bit vector for flipping the signs of LLRs from adjacent blocks.

Such a structure of the superposed encoded data may enable pre-encoding the time index(es) beforehand, because the time index may be encoded separately from the data. The time index might not be protected by the CRC bits.

Figure 6:
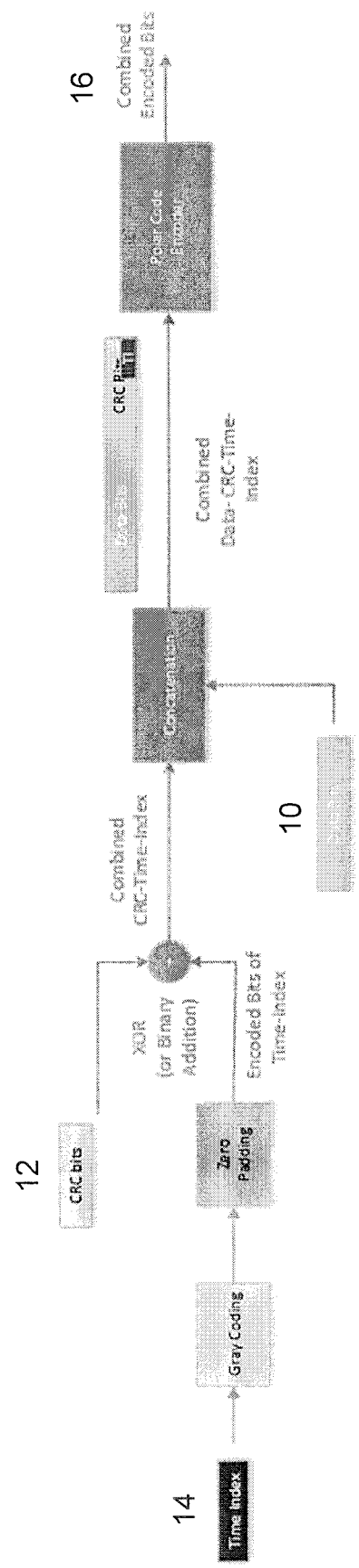
FIG. 6 is a block diagram of an encoding mechanism with identical codes used for encoding data and time index, according to some embodiments.

FIG. 6 illustrates a special case of the superposition coding described in FIG. 5. In the illustrated example, the second channel code is the same polar code used for data bits 10. Because of the linearity of polar coding, the combining of code bits can be transferred to the combining of time-index 14 and CRC bits 12 before polar encoding. Time-index 14 may be first Gray coded, zero padded to the same length as CRC bits 12, and added or XOR-ed to CRC bits 12. The combined CRC-time-index bits are concatenated with data bits 10. The concatenated information block is then encoded once by a polar encoder.

Figure 7:
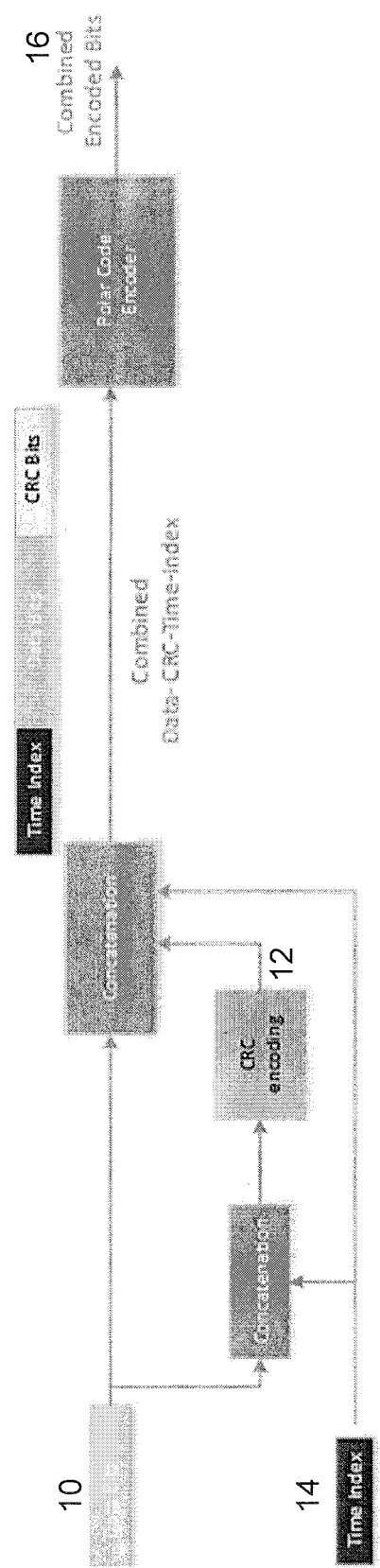
FIG. 7 is a block diagram of another encoding mechanism with identical codes used for encoding data and time index, according to some embodiments.
Figure 8:
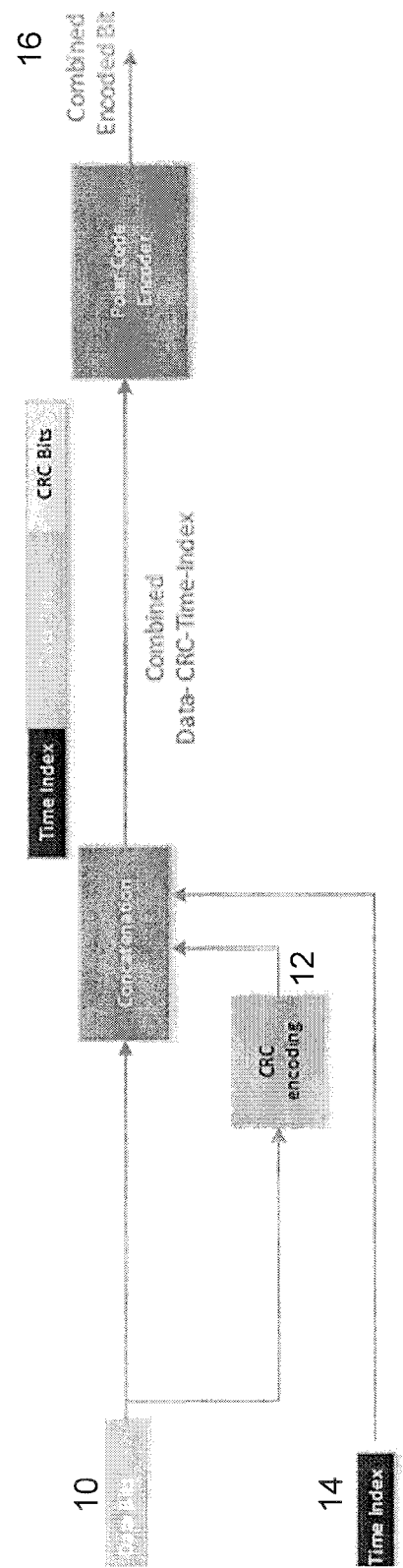
FIG. 8 is a block diagram of another encoding mechanism with identical codes used for encoding data and time index, according to some embodiments.

FIGS. 7 and 8 illustrate other ways of implementing superposition coding. In the illustrated examples, time-index 14 is concatenated with data bits 10 and CRC bits 12 before polar encoding. In other words, in some embodiments time index 14 can be viewed as additional data bits 10. A difference between the two figures is that FIG. 7 has time index 14 CRC coded together with data bits 10, while FIG. 8 does not have time index 14 CRC coded (i.e., CRC bits only depend on data bits 10). In the example illustrated in FIG. 7, the time index may be also CRC protected.

Figure 9:
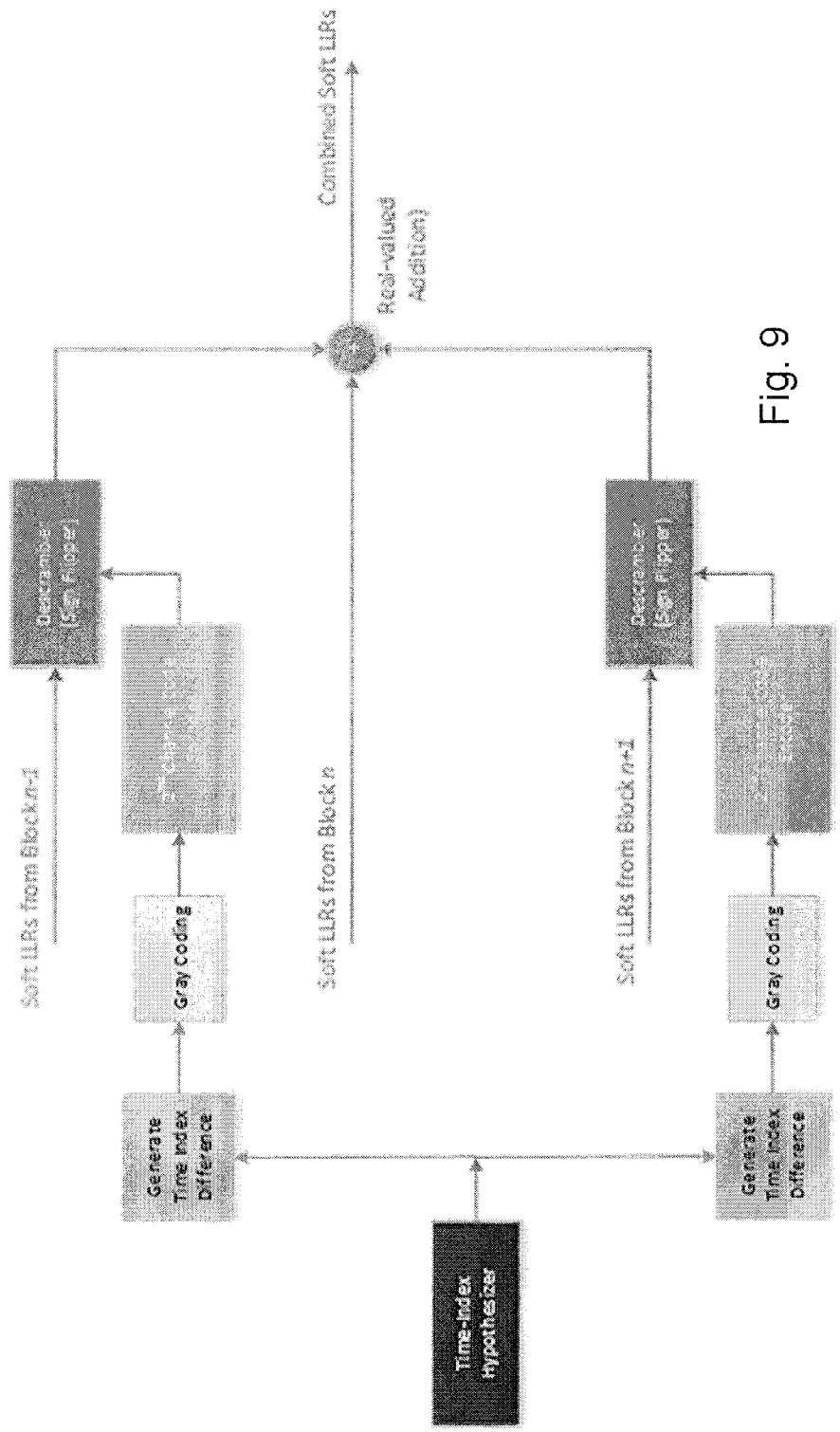
FIG. 9 is a block diagram of pre-combining LLRs from multiple adjacent signal blocks, according to some embodiments.

On the receiver side, FIG. 9 is a block diagram illustrating how to combine received LLRs of coded bits before channel decoding. The illustrated example assumes the receiver is combining LLRs over only three signal blocks, but the example can be generalized to combine LLRs over an arbitrary number of blocks. As illustrated, LLRs from each adjacent signal block are first descrambled (i.e., flipping the signs of LLRs) according to the encoded time index difference between the two adjacent times. In the case when Gray coding is done on the time index difference, only the rows in the generating matrix of the second channel code are used for descrambling, and thus no additional computation is needed to generate the descrambling mapping.

Figure 10:
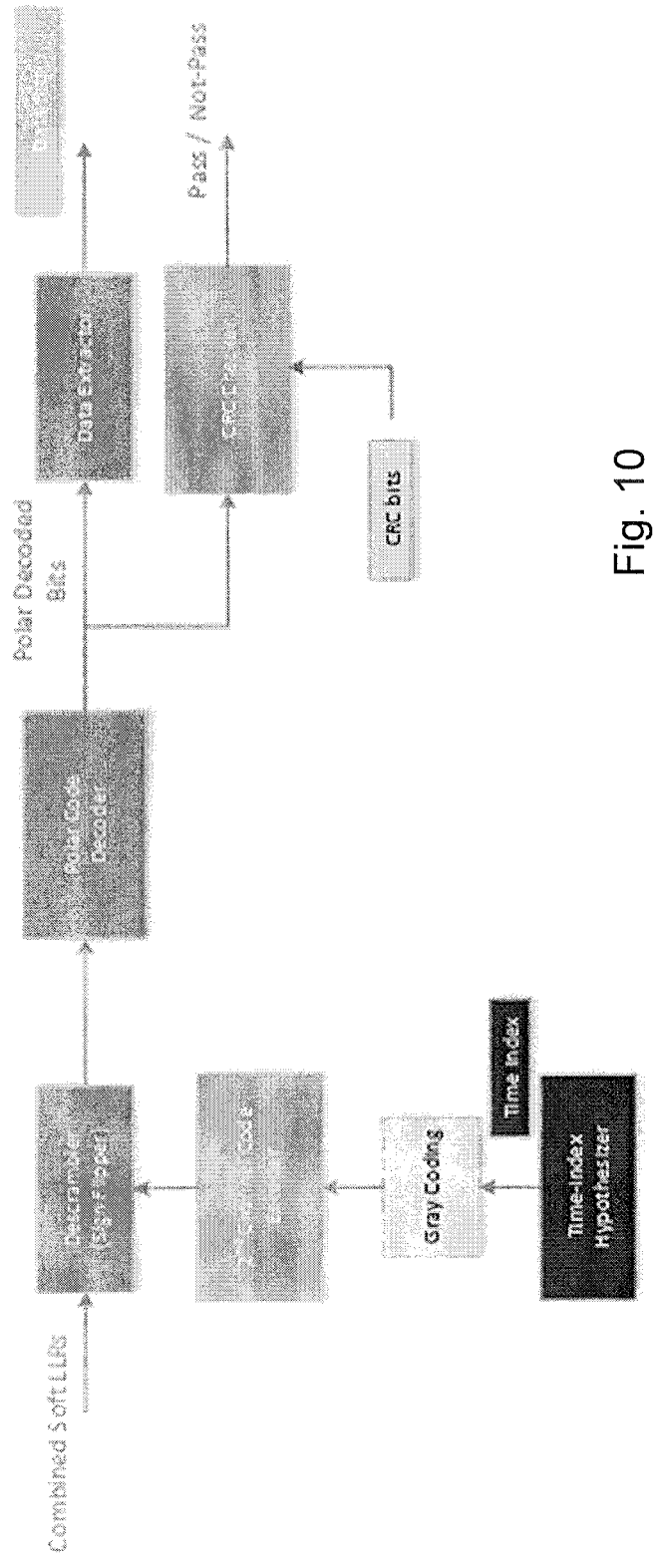
FIG. 10 is a block diagram of decoding based on descrambling according to hypothesized time index, according to some embodiments.

As illustrated in FIG. 10, after combining soft LLRs from adjacent single blocks, the combined LLRs are then descrambled again for every possible hypothesized time index for the current block. The descrambling process is based on the codeword produced by the second channel encoder in accordance with the hypothesis. For each hypothesis, the descrambled LLRs are fed into the polar decoder, whose output is then extracted.

Figure 11:
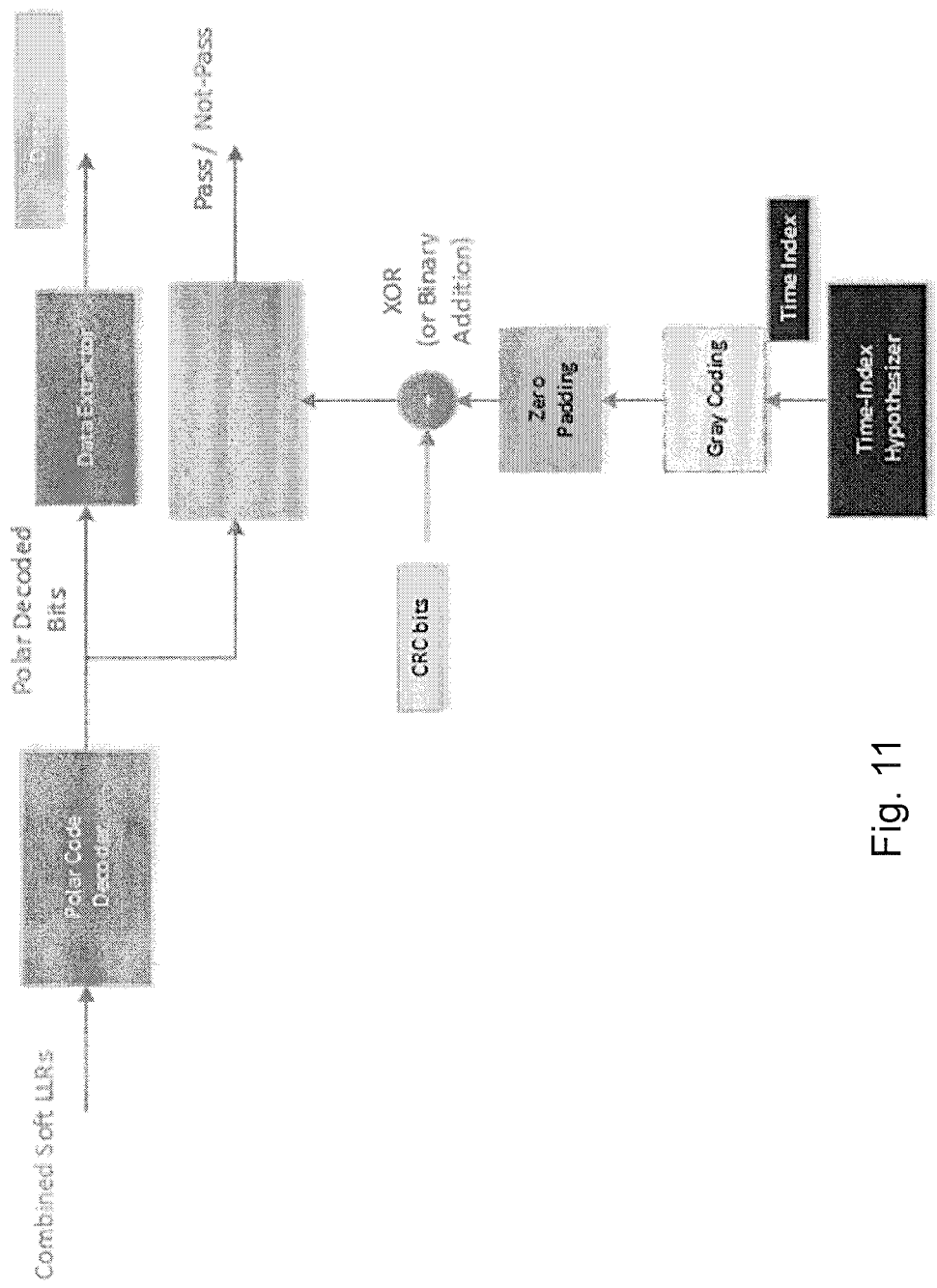
FIG. 11 is a block diagram of decoding based on descrambling based in hypothesized time index, according to some embodiments.
Figure 12:
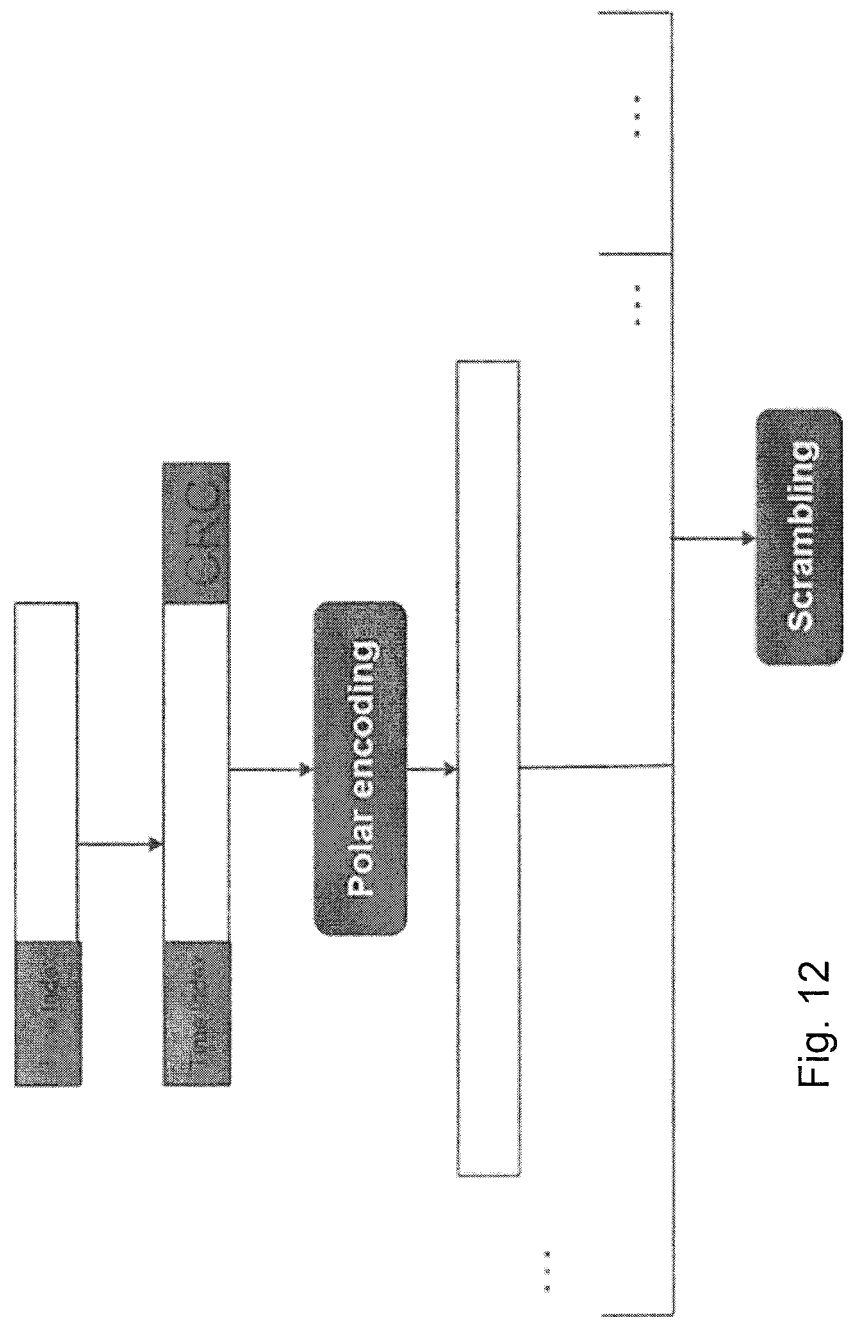
FIG. 12 illustrates polar encoding where a time index is explicitly carried as part of the information bits, according to some embodiments.
Figure 13:
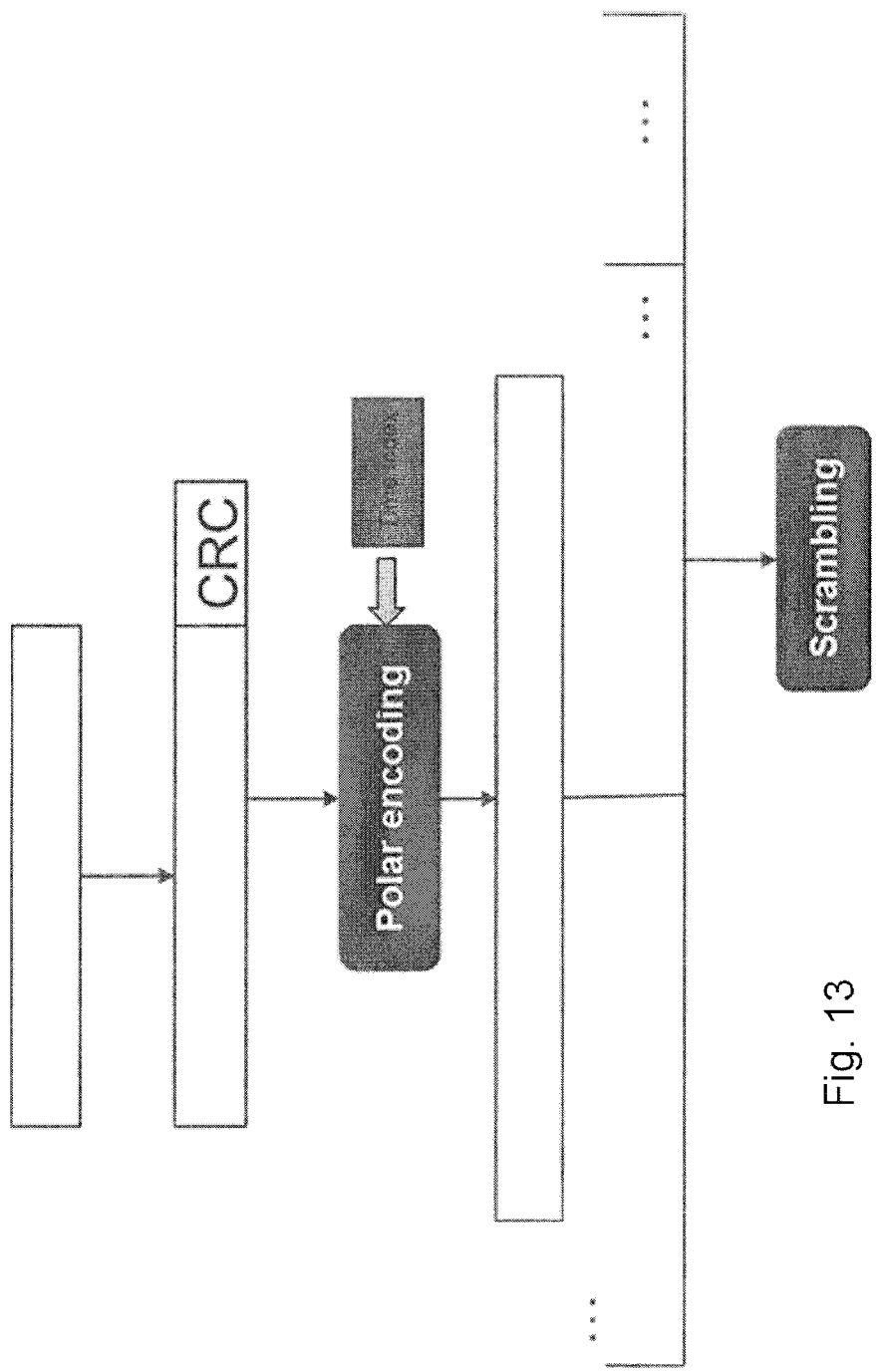
FIG. 13 illustrates polar encoding where a time index is carried by frozen bits, according to some embodiments.
Figure 14:
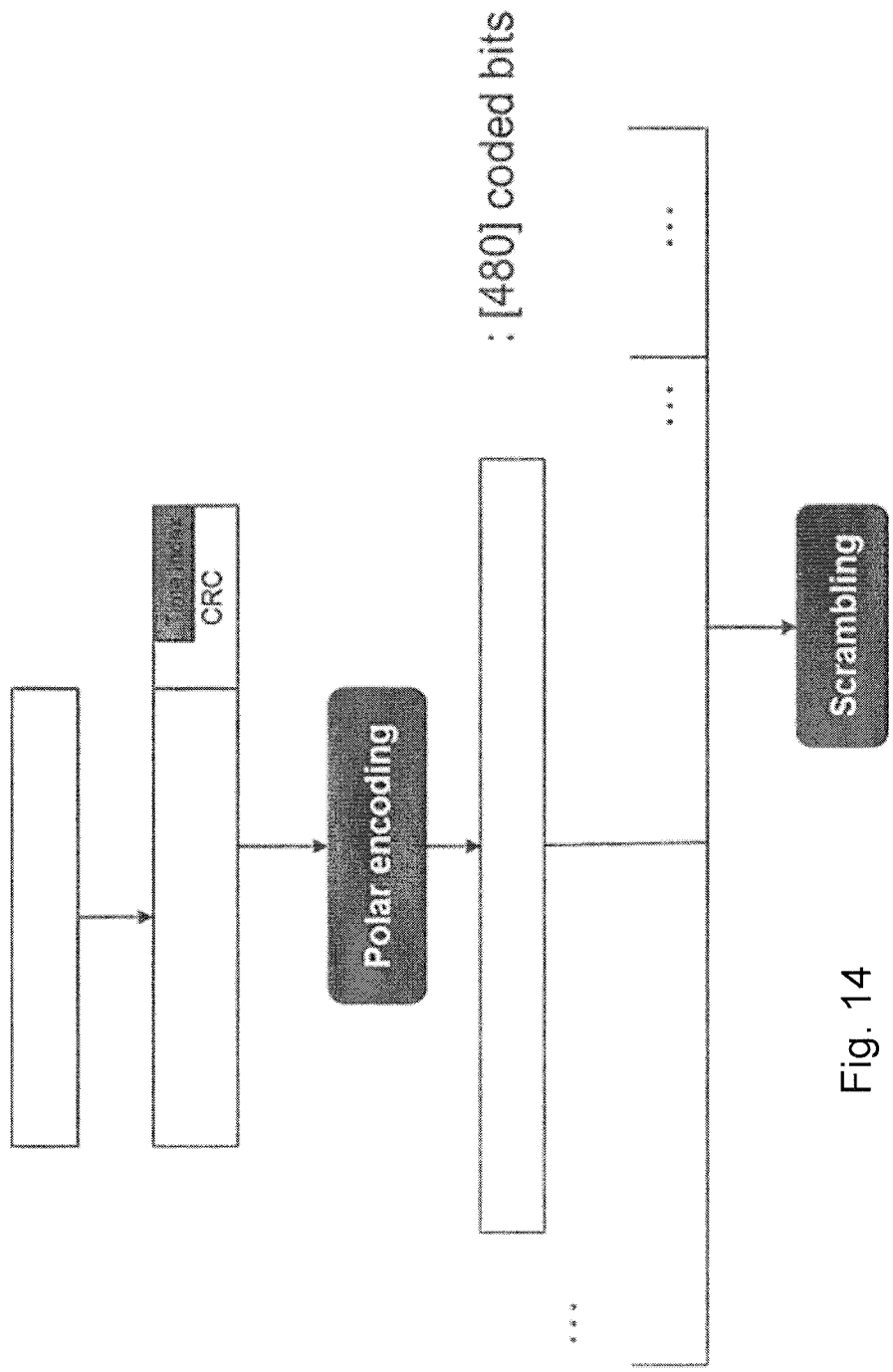
FIG. 14 illustrates polar encoding that uses color code CRC bits by time index, according to some embodiments.

FIG. 11 illustrates the decoder structure for the example described in FIG. 6 where the second channel code is the same polar code. In the illustrated example, the polar code is first decoded regardless of the time index. After obtaining the decoded bits from the output of the polar decoder, CRC bits are descrambled by the hypothesized time index. The descrambled CRC is then used to check if there is any error in decoded bits.

For FIGS. 6 and 7, the decoder structure is the same as conventional polar decoder with CRC encoded input, because the time index can be treated in the same way as the data bits.

Some embodiments include superposition of polar codes. In particular embodiments, the second channel code used to encode the time-varying information, such as Time Index, is also a polar code of the same block length as the polar code used to encode the non-time-varying information.

Particular embodiments may apply superposition coding, where a time-varying component is encoded and superimposed on the non-time-varying component. At the receiver side, then time-varying component can be removed, leaving the non-time-varying component only, so that multiple copies of the non-time-varying components can be accumulated and decoded.

For NR-PBCH, the time-varying component is the Time Index, the non-time-varying component is the MIB content that stays the same within a NR-PBCH TTI.

Various alternatives are available for constructing the superposition code. Some alternatives are illustrated using a polar code as the example channel coding method. In general, other linear codes can also be used in place of polar codes as described above.

Two receiver scenarios are as follows. In scenario A only one instance of NR-PBCH is received, and the receiver performs direct decoding of the one instance. In scenario B the receiver performs soft combining of multiple instances of NR-PBCH and then polar decoding of the combined channel LLR vector.

In a first group of embodiments, the Time Index is explicitly carried as a part of the information bits (i.e., the total number of information bits to be CRC encoded is increased by the number of bits needed for the Time Index). In this group of embodiments, which correspond to FIG. 12 for example, the Time Index bits are explicitly carried as a part of the information bits, and the CRC bits are generated to cover both the Time Index T and the rest of MIB bits U, [T U]. This is illustrated in FIG. 7. The Time-Index bits T can be located anywhere in front of the CRC bits, for example, [T U] or [U T].

When decoding one instance of NR-PBCH (i.e., scenario A), a CRC protects the Time Index. When trying to soft combine multiple instances of NR-PBCH (i.e., Scenario B), a cover code is derived, possibly based on a hypothesized value of Time Index, and used to remove the Time Index and the CRC vector corresponding to it. In this case, CRC bits are no longer a function of the Time Index after applying the cover code.

After the Time Index field is removed (i.e., set to all-zero) by applying a cover code, then the bit locations occupied by Time Index are effectively frozen bits. This helps with the polar decoder.

Steps of soft combining multiple instances of NR-PBCH may include the following:

1. Take $2^{N_T}$ hypothesis for the first received NR-PBCH instance, where $N_T$, $N_T \le 6$, is the number of bits of Time Index.
2. For hypothesis i, $0 \le i \le 2^{N_T}-1$, for each of the $N_B$ consecutively received NR_PBCH instance:
   a. For the j-th NR-PBCH instance, $0 \le j \le N_B-1$, find the polar code word $CW_{j'}$ corresponding to Time Index j', $0 \le j \le N_B-1$, and its related CRC vector, where the CRC vector is obtained by setting the rest of the information bits U to all-zero, i.e., the CRC bits correspond to $[T_{j'}, 0 \ldots 0]$. Bit vector $T_{j'}$ corresponds to Time Index j'
      i. For the first NR-PBCH instance, j=0; j'=mod(i, $2^{N_T}$);
      ii. For the $2^{nd}$ NR-PBCH instance, j=1; j'=mod(i+1, $2^{N_T}$);
      iii. For the 3rd NR-PBCH instance, j=2; j'=mod(i+2, $2^{N_T}$);
      iv. . . . .
   b. XOR the Polar code word $CW_j$ to the received channel LLR. This converts the channel LLR vector to the vector corresponding to NR-PBCH info bits, with Time Index bits T set to all-zero.
3. Soft combine the $N_B$ NR-PBCH instances.
4. Polar decode the combined channel LLR vector.

In a second group of embodiments, the Time Index is carried by frozen bits. In the second group of embodiments, which corresponds to FIG. 13 for example, the Time Index bits are carried by putting Time Index bits T on frozen bits. When taking hypothesis to enable soft combining, it is similar to the first group of embodiments.

A difference is, when decoding one instance of NR-PBCH, the Time Index is protected by CRC bits in the first group of embodiments, but not protected by CRC bits in the second group of embodiments.

Steps of soft combining multiple instances of NR-PBCH may include the following:

1. Take $2^{N_T}$ hypothesis for the first received NR-PBCH instance, where $N_T$, $N_T \le 6$, is the number of bits of Time Index.
2. For hypothesis i, $0 \le i \le 2^{N_T}-1$, for each of the $N_B$ consecutively received NR_PBCH instance:

a. For the j-th NR-PBCH instance, $0 \leq j \leq N_B-1$, find the polar code word $CW_{j'}$ corresponding to Time Index j', $0 \leq j \leq N_B-1$.
   i. For the first NR-PBCH instance, j=0; j'=mod(i, $2^{N_T}$);
   ii. For the $2^{nd}$ NR-PBCH instance, j=1; j'=mod(i+1, $2^{N_T}$);
   iii. For the 3rd NR-PBCH instance, j=2; j'=mod(i+2, $2^{N_T}$);
   iv. . . .
b. XOR the Polar code word CW to the received channel LLR. This converts the channel LLR vector to the vector corresponding to NR-PBCH information bits, with Time Index bits T set to all-zero and decoded as frozen bits.
3. Soft combine the $N_B$ NR-PBCH instances.
4. Polar decode the combined channel LLR vector.

In a third group of embodiments, the Time Index is carried by color coding the CRC bits. In the third group of embodiments, which corresponds to FIG. 14 for example, the Time Index bits are used to color code the CRC bits (i.e., the Time Index bits are XOR-ed on top of the CRC bits). Because there are 16 CRC bits, but at most 6 Time Index bits, only a fraction of the CRC bits are color coded.

Particular embodiments put the Time Index on the information side with highest index (i.e., highest reliability positions), so that the corresponding polar codeword has the largest distance between any two hypotheses.

The third group of embodiments has the benefit of relatively lower code rate in polar decoding. Similar to the second group of embodiments, the CRC bits do not protect the Time Index T.

Figure 15A:
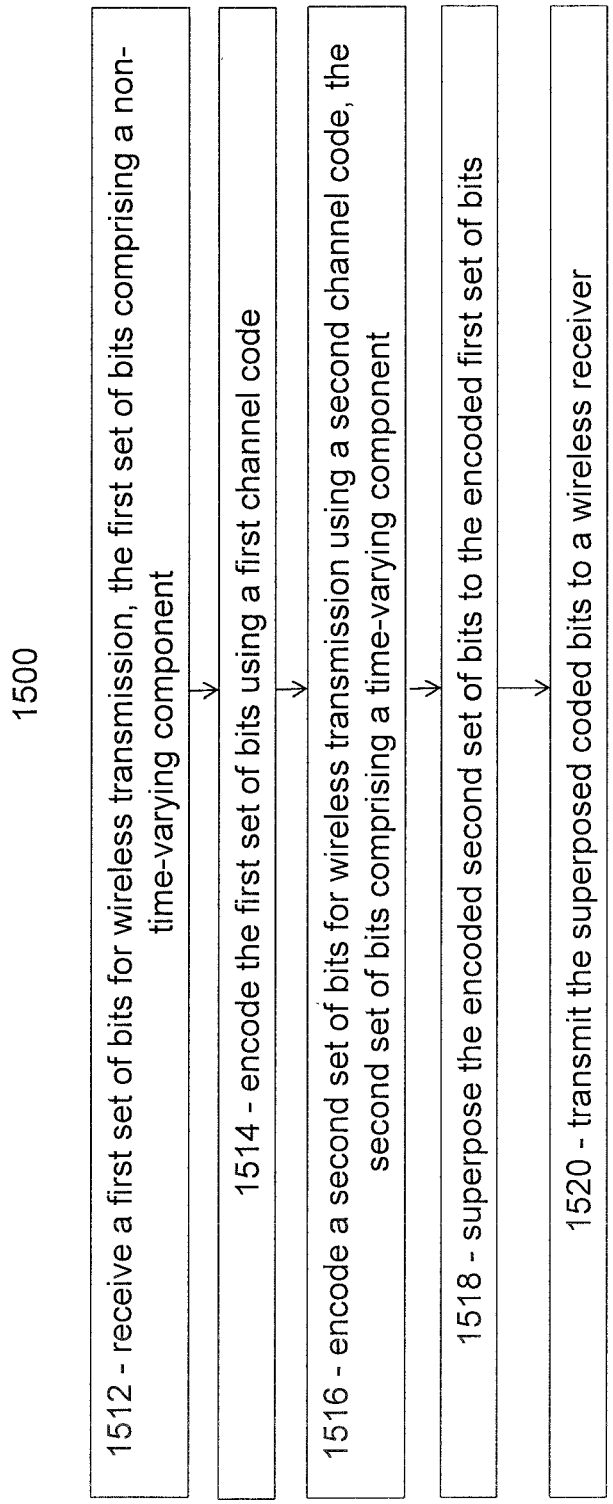
FIG. 15A is a flow diagram illustrating an example method in a wireless transmitter, according to some embodiments.
Figure 15B:
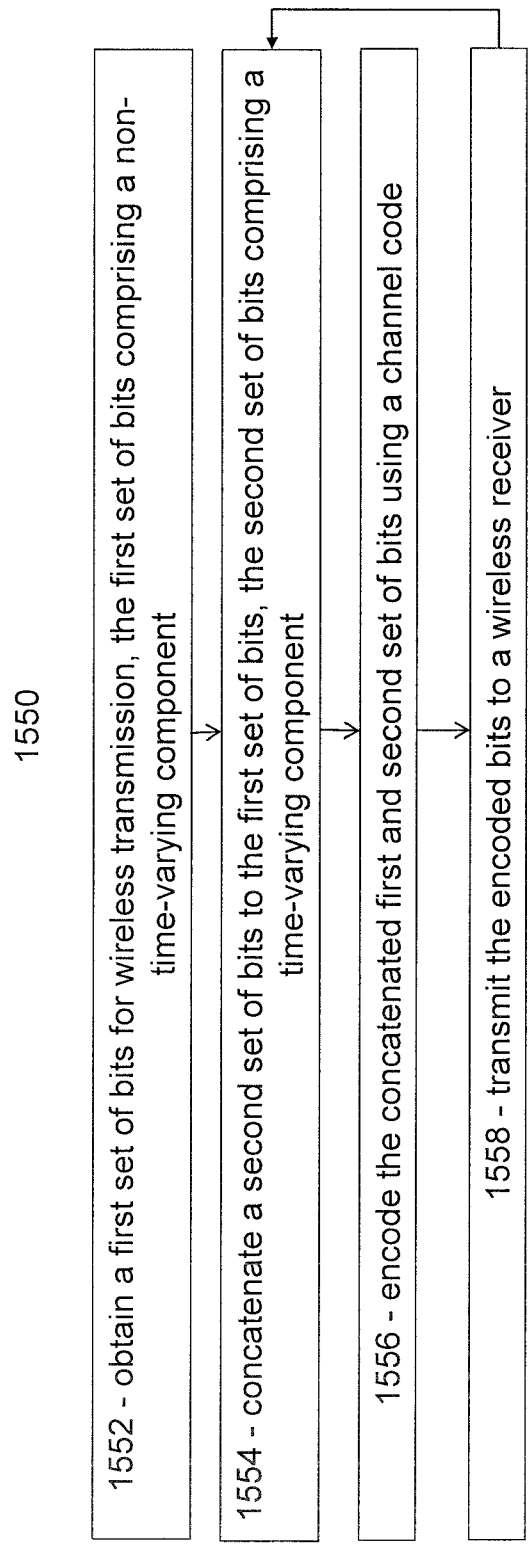
FIG. 15B is a flow diagram illustrating another example method in a wireless transmitter, according to some embodiments.
Figure 16A:
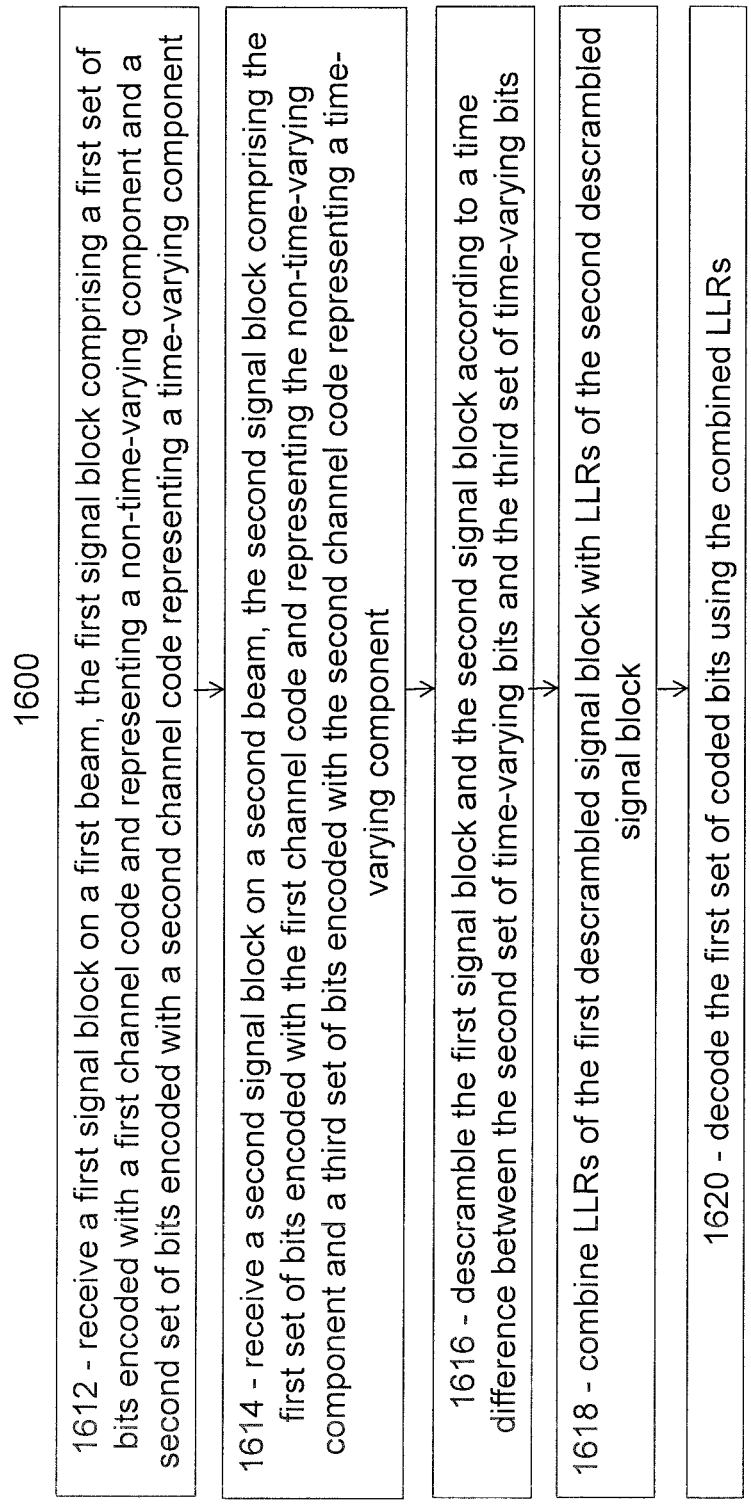
FIG. 16A is a flow diagram illustrating an example method in a wireless receiver, according to some embodiments.
Figure 16B:
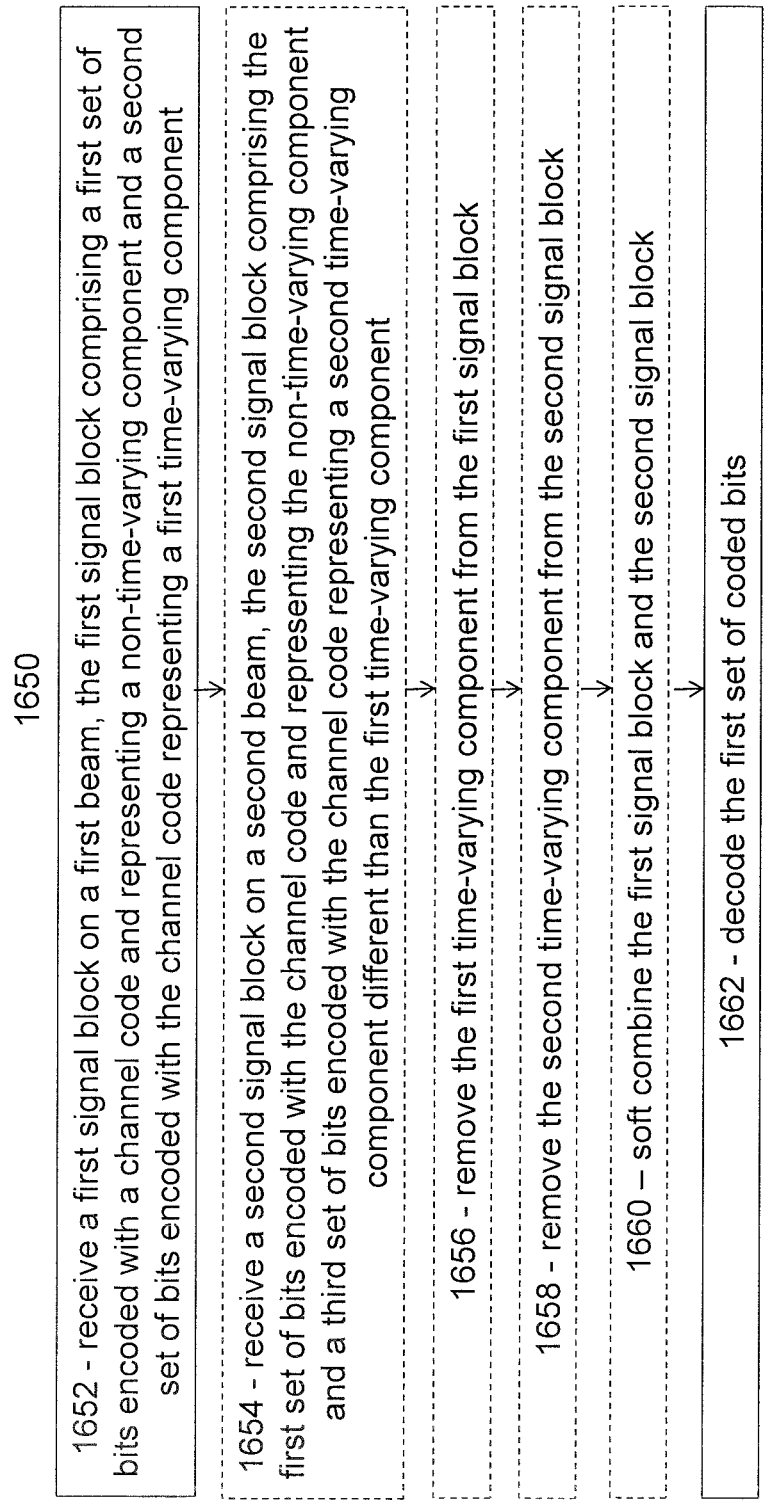
FIG. 16B is a flow diagram illustrating another example method in a wireless receiver, according to some embodiments.

The examples described above may be generally represented by the flowcharts in FIGS. 15A and 15B (with respect to a transmitter, such as network node 120) and FIGS. 16A and 16B (with respect to a receiver, such as wireless device 110).

FIG. 15A is a flow diagram illustrating an example method in a wireless device, according to some embodiments. In particular embodiments, one or more steps of FIG. 15A may be performed by network elements (e.g., network node 120, wireless device 110, etc.) of network 100 described with respect to FIG. 4.

The method begins at step 1512, where the wireless transmitter receives a first set of bits for wireless transmission, the first set of bits comprising a non-time-varying component. For example, network node 120 may receive system information for wireless transmission to wireless device 110.

At step 1514, the wireless transmitter encodes the first set of bits using a first channel code. For example, network node 120 may encode the system information using a polar code.

At step 1516, the wireless transmitter encodes encode a second set of bits for wireless transmission using a second channel code, the second set of bits comprising a time-varying component. For example, network node 120 may encode a time index using a second channel code, such as a polar code. In some embodiments, the wireless transmitter may encode the second set of bits with a gray code before encoding with the second channel code.

At step 1518, the wireless transmitter superposes the encoded second set of bits to the encoded first set of bits. For example, network node 120 may superpose (e.g., add) the encoded time index and the encoded system information.

At step 1520, the wireless transmitter transmits the superposed coded bits to a wireless receiver. For example, network node 120 may transmit the superposed coded bits to wireless device 110. Network node 120 may transmit the superposed coded bits using a first beam.

In particular embodiments, the wireless transmitter may repeat step 1516 to 1520 for any number of time indices and beams.

Modifications, additions, or omissions may be made to method 1500. Additionally, one or more steps in method 1500 of FIG. 15A may be performed in parallel or in any suitable order. The steps of method 1500 may be repeated over time as necessary.

FIG. 15B is a flow diagram illustrating another example method in a wireless device, according to some embodiments. In particular embodiments, one or more steps of FIG. 15B may be performed by network elements (e.g., network node 120, wireless device 110, etc.) of network 100 described with respect to FIG. 4.

The method begins at step 1552, where the wireless transmitter receives a first set of bits for wireless transmission. The first set of bits comprise a non-time-varying component. For example, network node 120 may receive system information (i.e., non-time-varying component), such as a MIB, for wireless transmission to wireless device 110.

At step 1554, the wireless transmitter concatenates a second set of bits to the first set of bits. The second set of bits comprises a time-varying component. For example, network node 120 may broadcast the system information in a plurality of SSBs using beam sweeping. Each SSB of the plurality of SSBs may be associated with a particular beam. Each SSB may be associated with a particular SSB index or time index. Network node 120 may concatenate the time index (i.e., time-varying component) to the system information.

In some embodiments, the wireless transmitter determines CRC bits for the concatenated first and second set of bits and concatenates the determined CRC bits to the concatenated first and second set of bits. For example, network node 120 may determine CRC bits for the combined system information and time index and concatenate the determined CRC bits to the end (or front) of the combined system information and time index bits (e.g., see FIG. 7).

In some embodiments, the wireless transmitter determines CRC bits for the second set of bits and concatenates the determined CRC bits to the second set of bits. For example, network node 120 may determine a CRC for just the second set of bits, not the first set of bits, and concatenate the CRC to the second set of bits before concatenating the combined second set of bits and CRC bits with the first set of bits (e.g., see FIG. 6).

At step 1556, the wireless transmitter encodes the concatenated first and second set of bits using a channel code. For example, network node 120 may encode the concatenated system information and time index using a channel code, such as a polar code.

At step 1558, the wireless transmitter transmits the encoded bits to a wireless receiver. For example, network node 120 may transmit the encoded time index and the encoded system information to wireless device 110 (e.g., as an SSB via NR-PBCH).

In some embodiments, network node 120 may transmit the encoded bits using a first beam. In particular embodiments, the wireless transmitter may repeat steps 1554 to 1558 for any number of time indices and beams (e.g., beam sweeping).

Modifications, additions, or omissions may be made to method 1500. Additionally, one or more steps in method 1550 of FIG. 15B may be performed in parallel or in any suitable order. The steps of method 1500 may be repeated over time as necessary.

FIG. 16A is a flow diagram illustrating an example method in a wireless receiver, according to some embodiments. In particular embodiments, one or more steps of FIG. 16A may be performed by network elements (e.g., wireless device 110, network node 120, etc.) of network 100 described with respect to FIG. 4.

The method begins at step 1612, where a wireless receiver receives a first signal block on a first beam, the first signal block comprising a first set of bits encoded with a first channel code and representing a non-time-varying component and a second set of bits encoded with a second channel code representing a time-varying component. For example, wireless device 110 may receive a first beam comprising system information and a first time index.

At step 1614, the wireless receiver receives a second signal block on a second beam, the second signal block comprising the first set of bits encoded with the first channel code and representing the non-time-varying component and a third set of bits encoded with a second channel code representing a time-varying component. For example, wireless device 110 may receive a second beam comprising the system information and a second time index.

At step 1616, the wireless receiver descrambles the first signal block and the second signal block according to a time difference between the second set of time-varying bits and the third set of time-varying bits. For example, wireless device 110 may descramble (i.e., flip the signs of LLRs) according to an encoded time index difference between the two adjacent times. In the case when Gray coding is done on the time index difference, only the rows in the generating matrix of the second channel code are used for descrambling, and thus no additional computation is needed to generate the descrambling mapping.

At step 1618, the wireless receiver combines LLRs of the first descrambled signal block with LLRs of the second descrambled signal block. For example, wireless device 110 may accumulate the first descrambled signal block and the second descrambled signal block.

At step 1620, the wireless receiver decodes the first set of coded bits using the combined LLRs. For example, wireless device 110 may decode the system information using the combined LLRs.

Although two signals are combined in this example, particular embodiments may combine any suitable number of signals received on any suitable number of beams.

Modifications, additions, or omissions may be made to method 1600. Additionally, one or more steps in method 1600 of FIG. 16A may be performed in parallel or in any suitable order. The steps of method 1600 may be repeated over time as necessary.

FIG. 16B is a flow diagram illustrating another example method in a wireless receiver, according to some embodiments. In particular embodiments, one or more steps of FIG. 16B may be performed by network elements (e.g., wireless device 110, network node 120, etc.) of network 100 described with respect to FIG. 4.

The method begins at step 1652, where a wireless receiver receives a first signal block on a first beam. The first signal block comprises a first set of bits encoded with a first channel code and represents a non-time-varying component and a second set of bits encoded with a second channel code that represents a time-varying component. For example, wireless device 110 may receive a first beam (e.g., via NR-PBCH) comprising system information and a first time index (e.g., SSB including MIB and SSB index).

In some embodiments, the method continues to step 1652, where the wireless receiver decodes the first of coded bits (e.g., using polar decoding). Other embodiments perform soft combining of multiple beams and continue to step 1654.

At step 1654, the wireless receiver receives a second signal block on a second beam. The second signal block comprises the first set of bits encoded with the first channel code and represents the non-time-varying component and a third set of bits encoded with a second channel code that represents a time-varying component. For example, wireless device 110 may receive a second beam comprising the same system information (e.g., same MIB) as received in the previous step and a second time index associated with the second beam.

At step 1656, the wireless receiver removes the first time-varying component from the first signal block. For example, wireless device 110 may zero out the time-varying component (e.g., time index) of the first signal block using hypothesis testing and/or orthogonal cover codes as described above.

At step 1658, the wireless receiver removes the second time-varying component from the second signal block. For example, wireless device 110 may zero out the time-varying component (e.g., time index) of the first signal block using hypothesis testing and/or orthogonal cover codes as described above.

In some embodiments, the wireless receiver descrambles the first signal block and the second signal block according to a time difference between the second set of time-varying bits and the third set of time-varying bits. For example, wireless device 110 may descramble (i.e., flip the signs of LLRs) according to an encoded time index difference between the two adjacent times. In the case when Gray coding is done on the time index difference, only the rows in the generating matrix of the second channel code are used for descrambling, and thus no additional computation is needed to generate the descrambling mapping.

At step 1660, the wireless receiver soft combines the first signal block and the second signal block. For example, wireless device 110 may accumulate the first signal block and the second signal block according to any of the examples and/or embodiments described above. In some embodiments, the wireless receiver combines LLRs of the first descrambled signal block with LLRs of the second descrambled signal block.

At step 1662, the wireless receiver decodes the first set of coded bits. For example, wireless device 110 may polar decode the first set of coded bits (e.g., either decode the first set of coded bits received at step 1652 or decode the soft combined bits from the previous step.) As a particular example, wireless device 110 may decode the system information using the combined LLRs.

Although two signals are combined in this example, particular embodiments may combine any suitable number of signals received on any suitable number of beams.

Modifications, additions, or omissions may be made to method 1650. Additionally, one or more steps in method 1650 of FIG. 16B may be performed in parallel or in any suitable order. The steps of method 1650 may be repeated over time as necessary.

Figure 17B:
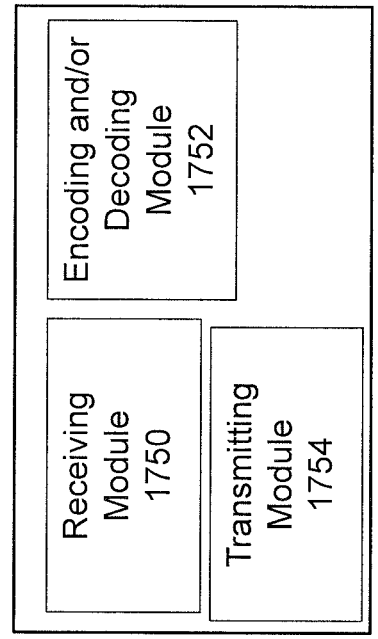
FIG. 17B is a block diagram illustrating example components of a wireless device.
Figure 17A:
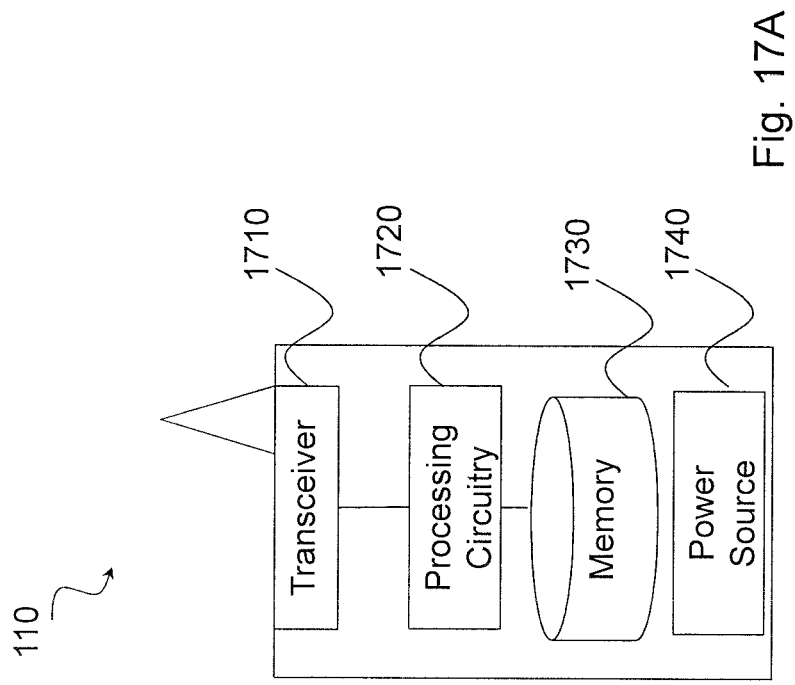
FIG. 17A is a block diagram illustrating an example embodiment of a wireless device.

FIG. 17A is a block diagram illustrating an example embodiment of a wireless device. The wireless device is an example of the wireless devices 110 illustrated in FIG. 4. In particular embodiments, the wireless device is capable of combining received LLRs from adjacent signal blocks (or beams), and computing the codeword of a second channel code that corresponds to a hypothesized difference in time index in adjacent signal blocks and using this codeword to flip the signs in the LLR values from adjacent blocks before adding them together into a combined LLRs, which may then be used to decode both the time index and the system information.

Particular examples of a wireless device include a mobile phone, a smart phone, a PDA (Personal Digital Assistant), a portable computer (e.g., laptop, tablet), a sensor, a modem, a machine type (MTC) device/machine to machine (M2M) device, laptop embedded equipment (LEE), laptop mounted equipment (LME), USB dongles, a device-to-device capable device, a vehicle-to-vehicle device, or any other device that can provide wireless communication. The wireless device includes transceiver 1710, processor or processing circuitry 1720, memory 1730, and power source 1740. In some embodiments, transceiver 1710 facilitates transmitting wireless signals to and receiving wireless signals from wireless network node 120 (e.g., via an antenna), processing circuitry 1720 executes instructions to provide some or all of the functionality described herein as provided by the wireless device, and memory 1730 stores the instructions executed by processing circuitry 1720. Power source 1740 supplies electrical power to one or more of the components of wireless device 110, such as transceiver 1710, processing circuitry 1720, and/or memory 1730.

Processing circuitry 1720 includes any suitable combination of hardware and software implemented in one or more integrated circuits or modules to execute instructions and manipulate data to perform some or all of the described functions of the wireless device. In some embodiments, processing circuitry 1720 may include, for example, one or more computers, one more programmable logic devices, one or more central processing units (CPUs), one or more microprocessors, one or more applications, and/or other logic, and/or any suitable combination of the preceding. Processing circuitry 1720 may include analog and/or digital circuitry configured to perform some or all of the described functions of wireless device 110. For example, processing circuitry 1720 may include resistors, capacitors, inductors, transistors, diodes, and/or any other suitable circuit components.

Memory 1730 is generally operable to store computer executable code and data. Examples of memory 1730 include computer memory (e.g., Random Access Memory (RAM) or Read Only Memory (ROM)), mass storage media (e.g., a hard disk), removable storage media (e.g., a Compact Disk (CD) or a Digital Video Disk (DVD)), and/or or any other volatile or non-volatile, non-transitory computer-readable and/or computer-executable memory devices that store information.

Power source 1740 is generally operable to supply electrical power to the components of wireless device 110. Power source 1740 may include any suitable type of battery, such as lithium-ion, lithium-air, lithium polymer, nickel cadmium, nickel metal hydride, or any other suitable type of battery for supplying power to a wireless device.

In particular embodiments, processing circuitry 1720 in communication with transceiver 1710 may receive encodings of data from multiple beams and combine the encodings from each beam to decode the data.

Other embodiments of the wireless device may include additional components (beyond those shown in FIG. 17A) responsible for providing certain aspects of the wireless device's functionality, including any of the functionality described above and/or any additional functionality (including any functionality necessary to support the solution described above).

FIG. 17B is a block diagram illustrating example components of a wireless device 110. The components may include receiving module 1750, encoding and/or decoding module 1752, and transmitting module 1754.

Receiving module 1750 may perform the receiving functions of wireless device 110. For example, receiving module 1750 may receive wireless signals on multiple beams according to any of the embodiments and/or examples described above (e.g., steps 1652 and 1654 of FIG. 16B). The wireless signals may include time-varying and non-time-varying bits. In certain embodiments, receiving module 1750 may include or be included in processing circuitry 1720. In particular embodiments, receiving module 1750 may communicate with encoding and/or decoding module 1752 and transmitting module 1754.

Encoding and/or decoding module 1752 may perform the encoding and decoding functions of wireless device 110. For example, encoding and/or decoding module 1752 may encode or decode multiple signals with a concatenation of time-varying and non-time-varying data according to any of the examples or embodiments described above (e.g., step 1556 of FIG. 15B, step 1662 of FIG. 16B). In certain embodiments, encoding and/or decoding module 1752 may include or be included in processing circuitry 1720. In particular embodiments, encoding and/or decoding module 1752 may communicate with receiving module 1752 and transmitting module 1754.

Transmitting module 1754 may perform the transmitting functions of wireless device 110. For example, transmitting module 1754 may transmit wireless signals on multiple beams according to any of the embodiments and/or examples described above (e.g., step 1558 of FIG. 15B). The wireless signals may include time-varying and non-time-varying bits. In certain embodiments, transmitting module 1754 may include or be included in processing circuitry 1720. In particular embodiments, transmitting module 1754 may communicate with receiving module 1750 and encoding and/or decoding module 1752.

Figure 18A:
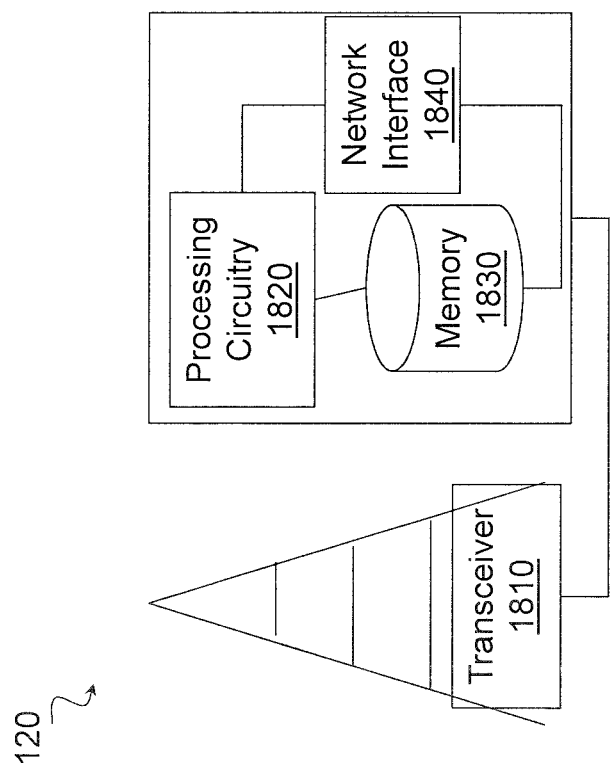
FIG. 18A is a block diagram illustrating an example embodiment of a network node.

FIG. 18A is a block diagram illustrating an example embodiment of a network node. The network node is an example of the network node 120 illustrated in FIG. 4. In particular embodiments, the network node is capable of polar encoding bits for transmission where a time-varying component (time index) is encoded and super-imposed on the non-time-varying component (system information, e.g., MIB content in NR).

Network node 120 can be an eNodeB, a nodeB, a base station, a wireless access point (e.g., a Wi-Fi access point), a low power node, a base transceiver station (BTS), a transmission point or node, a remote RF unit (RRU), a remote radio head (RRH), or other radio access node. The network node includes at least one transceiver 1810, processor or processing circuitry 1820, at least one memory 1830, and at least one network interface 1840. Transceiver 1810 facilitates transmitting wireless signals to and receiving wireless signals from a wireless device, such as wireless devices 110 (e.g., via an antenna); processing circuitry 1820 executes instructions to provide some or all of the functionality described above as being provided by a network node 120; memory 1830 stores the instructions executed by processing circuitry 1820; and network interface 1840 communicates signals to backend network components, such as a gateway, switch, router, Internet, Public Switched Telephone Network (PSTN), controller, and/or other network nodes 120. Processing circuitry 1820 and memory 1830 can be of the same types as described with respect to processing circuitry 1720 and memory 1730 of FIG. 17A above.

In some embodiments, network interface 1840 is communicatively coupled to processing circuitry 1820 and refers to any suitable device operable to receive input for network node 120, send output from network node 120, perform suitable processing of the input or output or both, communicate to other devices, or any combination of the preceding. Network interface 1840 includes appropriate hardware (e.g., port, modem, network interface card, etc.) and software, including protocol conversion and data processing capabilities, to communicate through a network.

In particular embodiments, processing circuitry 1820 in communication with transceiver 1810 polar encode bits for wireless transmission where a time-varying component (time index) is encoded and super-imposed on the non-time-varying component (system information, e.g., MIB content in NR).

Other embodiments of network node 120 include additional components (beyond those shown in FIG. 18A) responsible for providing certain aspects of the network node's functionality, including any of the functionality described above and/or any additional functionality (including any functionality necessary to support the solution described above). The various different types of network nodes may include components having the same physical hardware but configured (e.g., via programming) to support different radio access technologies, or may represent partly or entirely different physical components.

Figure 18B:
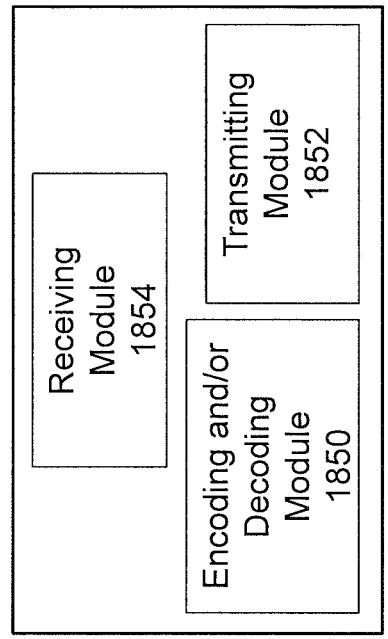
FIG. 18B is a block diagram illustrating example components of a network node.

FIG. 18B is a block diagram illustrating example components of network node 120. The components may include receiving module 1854, encoding and/or decoding module 1850 and transmitting module 1852.

Receiving module 1854 may perform the receiving functions of network node 120. For example, receiving module 1854 may obtain sets of bits for wireless transmission (e.g., steps 1552 and 1554 of FIG. 15B). The sets of bits may include time-varying and non-time-varying bits. In certain embodiments, receiving module 1854 may include or be included in processing circuitry 1820. In particular embodiments, receiving module 1854 may communicate with encoding and/or decoding module 1850 and transmitting module 1852.

Encoding and/or decoding module 1850 may perform the encoding/decoding functions of network node 120. For example, encoding and/or decoding module 1850 may encode and/or decode multiple signals with a concatenation of time-varying and non-time-varying data according to any of the examples or embodiments described above (e.g., step 1556 of FIG. 15B, step 1662 of FIG. 16B). In certain embodiments, encoding and/or decoding module 1850 may include or be included in processing circuitry 1820. In particular embodiments, encoding and/or decoding module 1850 may communicate with transmitting module 1852 and receiving module 1854.

Transmitting module 1852 may perform the transmitting functions of network node 120. For example, transmitting module 1852 may transmit multiple beams according to any of the examples or embodiments described above (e.g., step 1558 of FIG. 15B). In certain embodiments, transmitting module 1852 may include or be included in processing circuitry 1820. In particular embodiments, transmitting module 1852 may communicate with encoding and/or decoding module 1850 and receiving module 1854.

Modifications, additions, or omissions may be made to the systems and apparatuses disclosed herein without departing from the scope of the invention. The components of the systems and apparatuses may be integrated or separated. Moreover, the operations of the systems and apparatuses may be performed by more, fewer, or other components. Additionally, operations of the systems and apparatuses may be performed using any suitable logic comprising software, hardware, and/or other logic. As used in this document, "each" refers to each member of a set or each member of a subset of a set.

Modifications, additions, or omissions may be made to the methods disclosed herein without departing from the scope of the invention. The methods may include more, fewer, or other steps. Additionally, steps may be performed in any suitable order.

Although this disclosure has been described in terms of certain embodiments, alterations and permutations of the embodiments will be apparent to those skilled in the art. Accordingly, the above description of the embodiments does not constrain this disclosure. Other changes, substitutions, and alterations are possible without departing from the spirit and scope of this disclosure, as defined by the claims below.

Abbreviations Used in the Preceding Description Include

3D Three Dimensional
3GPP Third Generation Partnership Project
BTS Base Transceiver Station
CRC Cyclic Redundancy Check
D2D Device to Device
eNB eNodeB
FDD Frequency Division Duplex
IEEE Institute of Electrical and Electronics Engineers
LDPC Low-Density Parity-Check
LLR Log-Likelihood Ratio
LTE Long Term Evolution
MAC Medium Access Control
M2M Machine to Machine
MIB Master Information Block
MIMO Multi-Input Multi-Output
ML Maximum Likelihood
MTC Machine Type Communication
NR New Radio
PBCH Physical Broadcast Channel
PDSCH Physical Downlink Shared Channel
PUCCH Physical Uplink Control Channel
RAN Radio Access Network
RAT Radio Access Technology
RBS Radio Base Station
RNC Radio Network Controller
RRC Radio Resource Control
RRH Remote Radio Head
RRU Remote Radio Unit
SC Successive Cancellation
SCL Successive Cancellation List
SINR Signal-to-Interference-plus-Noise Ratio
SS Synchronization Signal
SSB Synchronization Signal Block
TDD Time Division Duplex
TTI Transmission Time Interval
UE User Equipment
UL Uplink
UTRAN Universal Terrestrial Radio Access Network
WAN Wireless Access Network The following list provides non-limiting examples of how certain aspects of the proposed solutions could be implemented. The examples are merely intended to illustrate how certain aspects of the proposed solutions could be implemented, however, the proposed solutions could also be implemented in other suitable manners. Examples include:

Example Transmitter Embodiments

E1. A method for use in a wireless transmitter, the method comprising:
receiving a first set of bits for wireless transmission, the first set of bits comprising a non-time-varying component;
encoding the first set of bits using a first channel code;
encoding a second set of bits for wireless transmission using a second channel code, the second set of bits comprising a time-varying component;
superposing the encoded second set of bits to the encoded first set of bits; and
transmitting the superposed coded bits to a wireless receiver.

E2. The method of Embodiment E1, wherein transmitting the superposed coded bits to a wireless receiver comprising transmitting on a first beam;
the method further comprising:
encoding a third set of bits for wireless transmission using the second channel code, the second set of bits comprising a time-varying component;
superposing the encoded third set of bits to the encoded first set of bits; and
transmitting the superposed coded bits to the wireless receiver on a second beam different than the first beam.

E3. The method of any of Embodiments E1-E2, wherein the first channel code comprises a polar code.

E4. The method of any of Embodiments E1-E3, wherein the second channel code comprises a polar code.

E5. The method of Embodiment E4, wherein a block length of the second channel code is the same as a block length of the first channel code.

E6. The method of any of Embodiment E1-E5, further comprising encoding the second set of bits with a gray code before encoding with the second channel code.

E7. The method of any of Embodiments E1-E6, wherein the non-time-varying component comprises system information and the time-varying information comprises a time index.

E8. A wireless transmitter comprising processing circuitry operable to perform the method of any of Embodiments E1-E7.

E9. The wireless transmitter of Embodiment E8, wherein the wireless transmitter comprises a network node.

Example Receiver Embodiments

E1. A method for use in a wireless receiver, the method comprising:
receiving a first signal block on a first beam, the first signal block comprising a first set of bits encoded with a first channel code and representing a non-time-varying component and a second set of bits encoded with a second channel code representing a time-varying component;
receiving a second signal block on a second beam, the second signal block comprising the first set of bits encoded with the first channel code and representing the non-time-varying component and a third set of bits encoded with the second channel code representing a time-varying component;
descrambling the first signal block and the second signal block according to a time difference between the second set of time-varying bits and the third set of time-varying bits;
combining log-likelihood ratios (LLRs) of the first descrambled signal block with LLRs of the second descrambled signal block; and
decoding the first set of coded bits using the combined LLRs.

E2. The method of Embodiment E1, wherein the first channel code comprises a polar code.

E3. The method of any of Embodiments E1-E2, wherein the second channel code comprises a polar code.

E4. The method of Embodiment E3, wherein a block length of the second channel code is the same as a block length of the first channel code.

E5. The method of any of Embodiments E1-E4, wherein the non-time-varying component comprises system information and the time-varying information comprises a time index.

E6. A wireless receiver comprising processing circuitry operable to perform the method of any of Embodiments E1-E5.

E7. The wireless receiver of Embodiment E6, wherein the wireless receiver comprises a wireless device.

The invention claimed is:

1. A method for use in a wireless receiver, the method comprising:
receiving a first signal block on a first beam, the first signal block comprising a first set of bits encoded with a first channel code and representing a non-time-varying component and a second set of bits encoded with a second channel code and representing a first time-varying component, wherein the first time varying-component of the second set of bits is associated with the first beam, and wherein the non-time-varying component comprises system information;
receiving a second signal block on a second beam, the second signal block comprising the first set of bits encoded with the first channel code and representing the non-time-varying component and a third set of bits encoded with the second channel code and representing a second time-varying component different than the first time-varying component, wherein the second time varying-component of the third set of bits is associated with the second beam, and wherein the first and second time-varying components each comprise a time index;
descrambling the first signal block and the second signal block according to a time difference between the second set of time-varying bits and the third set of time-varying bits by computing the codeword of the second channel code that corresponds to the hypothesized difference in the time index in the adjacent first and second signal blocks and using the codeword to flip the signs in values of log-likelihood ratios, LLRs, from the adjacent first and second signal blocks before adding them together into a combined LLR;
combining LLRs of the first descrambled signal block with LLRs of the second descrambled signal block to combine the received LLRs from the adjacent first and second signal blocks; and
decoding the first set of coded bits using the combined LLRs to decode both the time index and the system information.

2. The method of claim 1, wherein the second channel code comprises a polar code, or wherein a block length of the second channel code is the same as a block length of the first channel code, or wherein the decoding comprises polar decoding, or wherein the first beam is received from a first direction and the second beam is received from a second direction different than the first direction, optionally wherein the first beam is adjacent the second beam.

3. The method of claim 1, wherein the first beam is received in a first transmission time interval (TTI) and the second beam is received in a second TTI different than the first TTI.

4. The method of claim 1, wherein the system information comprises a master information block (MIB), the time index comprises a synchronization signal block (SSB) index, and receiving the first or second signal block comprises receiving a physical broadcast channel (PBCH), further optionally wherein the MIB is a component of an SSB.

5. The method of claim 1, wherein the wireless receiver comprises a wireless device.

6. The method of claim 1, wherein the second channel code used to encode the time-varying component including the time index is also a polar code of the same block length as the polar code used as the first channel code to encode the non-time-varying component.

7. A wireless receiver comprising processing circuitry operable to:
 receive a first signal block on a first beam, the first signal block comprising a first set of bits encoded with a first channel code and representing a non-time-varying component and a second set of bits encoded with a second channel code representing a first time-varying component, wherein the first time varying-component of the second set of bits is associated with the first beam, and wherein the non-time-varying component comprises system information;
 receive a second signal block on a second beam, the second signal block comprising the first set of bits encoded with the first channel code and representing the non-time-varying component and a third set of bits encoded with the second channel code and representing a second time-varying component different than the first time-varying component, wherein the second time varying-component of the third set of bits is associated with the second beam, and wherein the first and second time-varying components each comprise a time index;
 descramble the first signal block and the second signal block according to a time difference between the second set of time-varying bits and the third set of time-varying bits by computing the codeword of the second channel code that corresponds to the hypothesized difference in the time index in the adjacent first and second signal blocks and using the codeword to flip the signs in values of log-likelihood ratios, LLRs, from the adjacent first and second signal blocks before adding them together into a combined LLR;
 combine LLRs of the first descrambled signal block with LLRs of the second descrambled signal block to combine the received LLRs from the adjacent first and second signal blocks; and
 decode the first set of coded bits using the combined LLRs to decode both the time index and the system information.

8. The wireless receiver of claim 7, wherein the second channel code comprises a polar code, or wherein a block length of the second channel code is the same as a block length of the first channel code, or wherein the processing circuitry is operable to decode using polar decoding, or wherein the processing circuitry is operable to receive the first beam from a first direction and receive the second beam from a second direction different than the first direction, optionally wherein the first beam is adjacent the second beam.

9. The wireless receiver of claim 7, wherein the first beam is received in a first transmission time interval (TTI) and the second beam is received in a second TTI different than the first TTI.

10. The wireless receiver of claim 7, wherein the system information comprises a master information block (MIB), the time index comprises a synchronization signal block (SSB) index, and receiving the first or second signal block comprises receiving a physical broadcast channel (PBCH), further optionally the MIB is a component of an SSB.

11. The wireless receiver of claim 7, wherein the wireless receiver comprises a wireless device.

12. The wireless receiver of claim 7, wherein the second channel code used to encode the time-varying component including the time index is also a polar code of the same block length as the polar code used as the first channel code to encode the non-time-varying component.

\* \* \* \* \*